United States Patent [19]
Ishiguro et al.

[11] Patent Number: 5,612,608
[45] Date of Patent: Mar. 18, 1997

[54] APPARATUS FOR DISPLAYING RESIDUAL CAPACITY OF BATTERY FOR USE ON ELECTRIC VEHICLE

[75] Inventors: Kazunari Ishiguro; Morio Kayano, both of Wako, Japan

[73] Assignee: Honda Giken Kogyo Kabushiki Kaisha, Tokyo, Japan

[21] Appl. No.: 365,294

[22] Filed: Dec. 28, 1994

[30] Foreign Application Priority Data

Dec. 28, 1993 [JP] Japan ..................... 5-336774

[51] Int. Cl.$^6$ .......................... G01N 27/416; H02J 7/00
[52] U.S. Cl. ............................... 320/48; 324/435
[58] Field of Search ..................... 320/5, 44, 48; 324/427, 428, 431, 435

[56] References Cited

U.S. PATENT DOCUMENTS

| | | | |
|---|---|---|---|
| 4,560,937 | 12/1985 | Finger | 320/48 X |
| 5,047,961 | 9/1991 | Simonsen | 320/48 X |
| 5,352,982 | 10/1994 | Nakazawa et al. | 324/427 |
| 5,412,323 | 5/1995 | Kato et al. | 324/429 |
| 5,422,822 | 6/1995 | Toyota et al. | 324/427 X |
| 5,479,085 | 12/1995 | Honda et al. | 320/48 |

FOREIGN PATENT DOCUMENTS 54-63328  5/1979  Japan .

OTHER PUBLICATIONS

English language Abstract of JP 54-63328.

*Primary Examiner*—Peter S. Wong
*Assistant Examiner*—Patrick B. Law
*Attorney, Agent, or Firm*—Lyon & Lyon

[57] ABSTRACT

An apparatus for displaying the residual capacity of a battery includes a temperature indicator composed of a linear array of spaced light-emitting elements for displaying the temperature of the battery by way of light emitted from a succession of those of the light-emitting elements which correspond to the temperature of the battery detected by a temperature detector, a fully charged capacity indicator composed of a linear array of spaced light-emitting elements for displaying the fully charged capacity of the battery in association with the displayed temperature of the battery by way of light emitted from one of the light-emitting elements which is in a position corresponding to the fully charged capacity obtained based on the temperature of the battery, and a residual capacity indicator composed of a linear array of spaced light-emitting elements for displaying the residual capacity of the battery in association with the fully charged capacity by way of light emitted from a succession of those of the light-emitting elements which correspond to the residual capacity calculated by an electronic control unit.

10 Claims, 25 Drawing Sheets

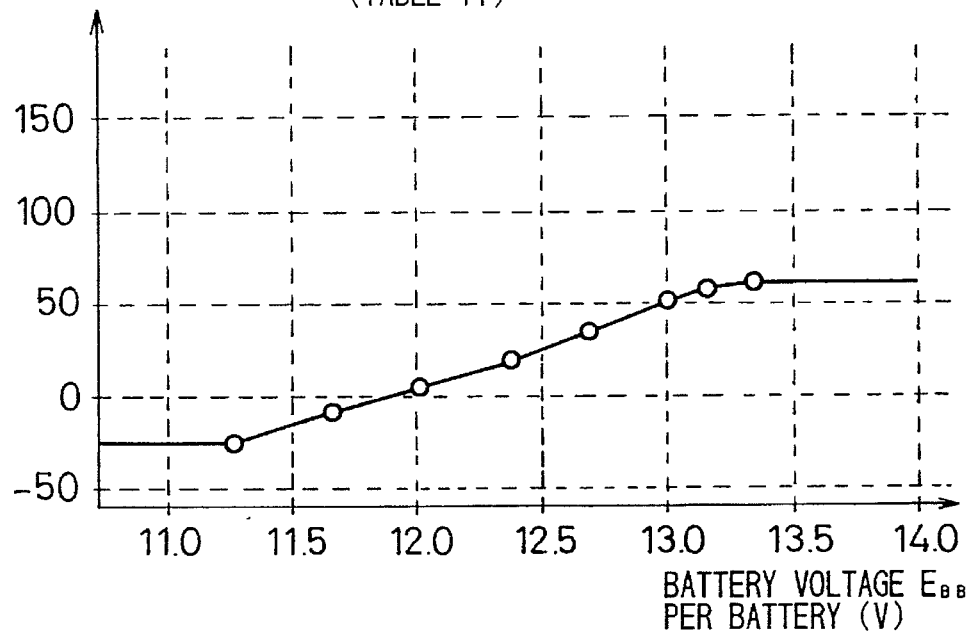
FIG.3A (TABLE T1)
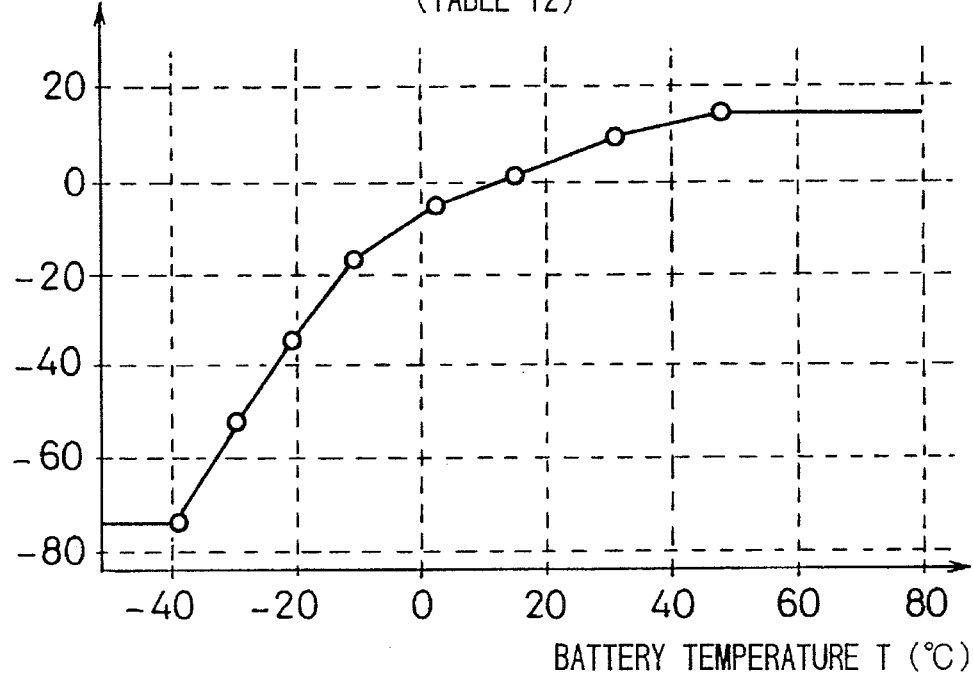
FIG.3B (TABLE T2)

(TABLE T3)

(TABLE T4)

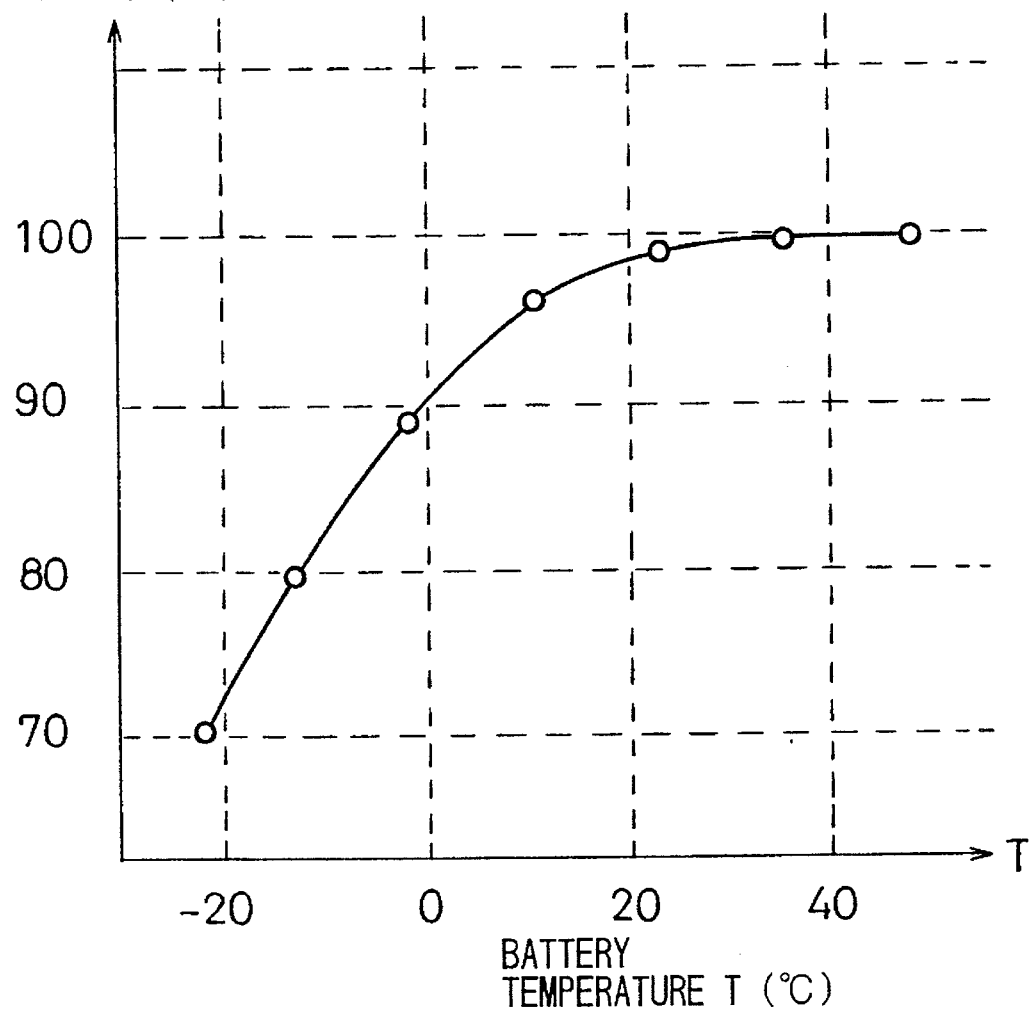

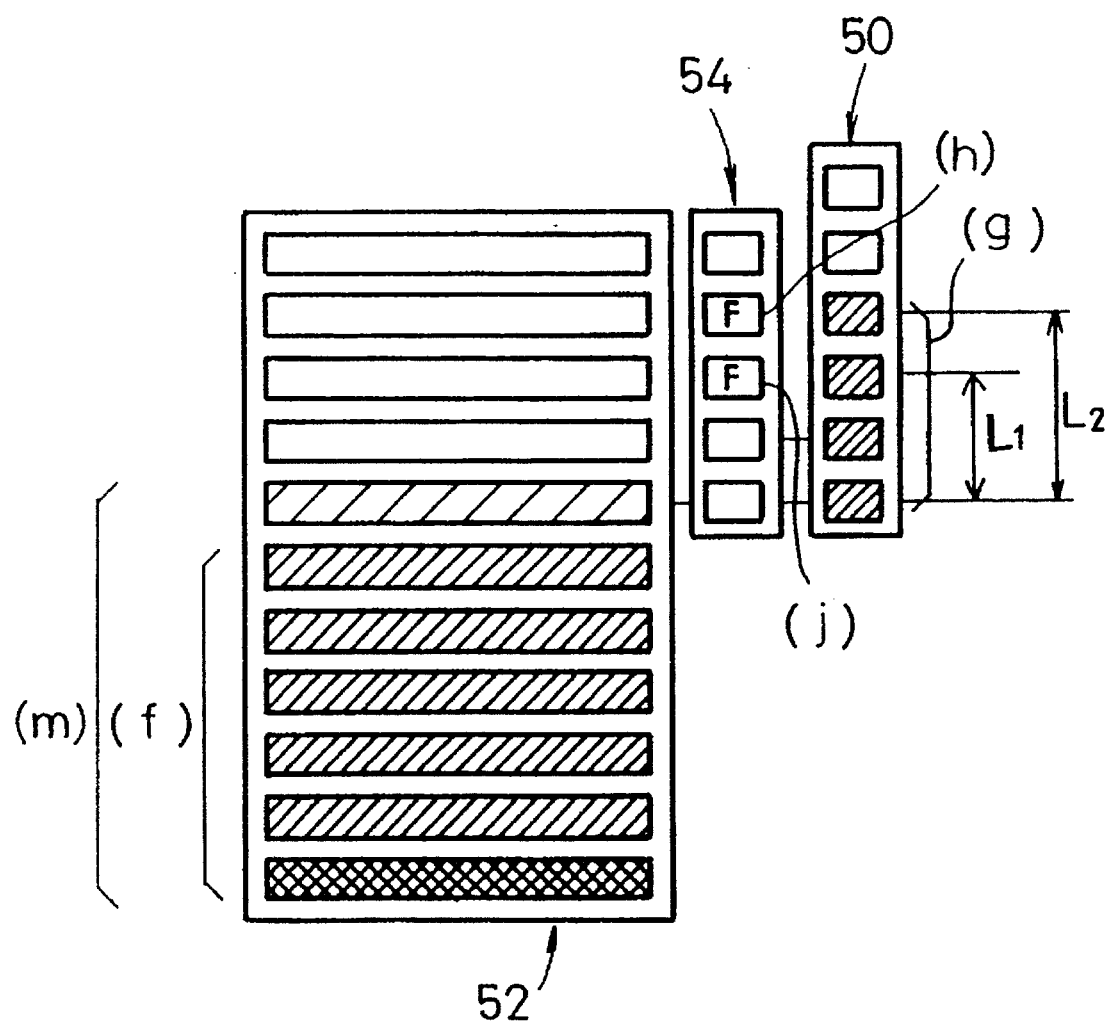

APPARATUS FOR DISPLAYING RESIDUAL CAPACITY OF BATTERY FOR USE ON ELECTRIC VEHICLE

BACKGROUND OF THE INVENTION

1. Field of the Invention

The present invention relates to an apparatus for displaying the residual capacity of a battery for use on an electric vehicle, and more particularly to an apparatus for displaying the residual capacity of a battery for energizing an electric motor to propel an electric vehicle, the fully charged capacity of the battery, and the temperature of the battery in a manner to be related to each other.

2. Description of the Related Art

Electric vehicles carry secondary batteries that are chargeable for reuse as a power supply for energizing motors for propelling the electric vehicles and various electric accessories.

On the electric vehicle, the residual capacity of the battery is detected, and data of the detected residual capacity are displayed in an analog representation by a pointer-type meter. Based on the displayed residual capacity, the driver estimates the distance that the electric vehicle can travel before the electric vehicle starts to run or while it is running.

Japanese laid-open patent publication No. 54-63328 discloses a technical concept of displaying the used capacity of a cell.

According to the above publication, a change in the voltage across a cell while it is being discharged is detected, and the energy discharged from the cell is calculated based on the detected voltage change. A display device comprises a linear array of light-emitting diodes. A number of successive light-emitting elements, which correspond to the discharged energy which is calculated, from one end of the array are energized to display the discharged energy. The user of the cell can estimate the residual capacity of the cell based on the displayed discharged energy.

The arrangement in which the data of the detected residual capacity is displayed in an analog manner by the pointer-type meter is disadvantageous in that the data may not correctly be displayed due to an error of the pointer-type meter.

The secondary batteries mounted on electric vehicles are degraded when they are repeatedly charged and discharged. The fully charged capacity of the batteries is lowered when the batteries are degraded. Since the rated capacity of a secondary battery varies depending on the temperature of the battery, it is difficult to estimate the residual capacity of the battery highly accurately from the energy discharged from the battery.

It has therefore been desirable to add the display of the fully charged capacity of a battery on an electric vehicle to the display of the residual capacity of the battery.

SUMMARY OF THE INVENTION

It is therefore an object of the present invention to provide an apparatus for highly accurately displaying the fully charged capacity of a battery on an electric vehicle in relation to the fully charged capacity of the battery.

According to the present invention, the above object can be achieved by an apparatus for displaying a residual capacity of a battery for energizing an electric motor to propel an electric vehicle, comprising battery temperature detecting means for detecting a temperature of the battery, current detecting means for detecting a current of the battery, voltage detecting means for detecting a voltage of the battery, battery temperature indicating means composed of a linear array of spaced light-emitting elements for displaying the temperature of the battery by way of light emitted from either one of the light-emitting elements which is in a position corresponding to the temperature of the battery detected by the battery temperature detecting means or a succession of those light-emitting elements which correspond to the temperature of the battery detected by the battery temperature detecting means, memory means for storing fully charged capacities corresponding respectively to temperatures of the battery, fully charged capacity reading means for reading one of the fully charged capacities which corresponds to the temperature of the battery detected by the battery temperature detecting means from the memory means, fully charged capacity indicating means composed of a linear array of spaced light-emitting elements for displaying the fully charged capacity of the battery in association with the temperature of the battery displayed by the battery temperature indicating means by way of light emitted from one of the light-emitting elements which is in a position corresponding to the fully charged capacity read by the fully charged capacity reading means, residual capacity calculating means for calculating a residual capacity of the battery while the battery is being discharged based on a discharging current detected by the current detecting means and a voltage detected by the voltage detecting means when the battery is being discharged and for calculating a residual capacity of the battery while the battery is being charged based on a discharging current detected by the current detecting means and a voltage detected by the voltage detecting means when the battery is being charged, and residual capacity indicating means composed of a linear array of spaced light-emitting elements for displaying the residual capacity of the battery in association with the fully charged capacity of the battery displayed by the fully charged capacity indicating means by way of light emitted from a succession of those light-emitting elements which correspond to the residual capacity calculated by the residual capacity calculating means.

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIG. 3A is a graph showing a look-up table stored in an LUT memory in the apparatus shown in FIG. 1, which represents the relationship between the voltage per battery and the residual capacity of batteries;

FIG. 3B is a graph showing a look-up table stored in the LUT memory which represents the relationship between the temperature of the batteries and the temperature corrective capacity;

FIG. 6 is a graph showing a look-up table stored in the LUT memory which represents the relationship between the battery temperature and the fully charged capacity thereof;

FIG. 19 is a view showing the relationship between the battery temperature displayed by the temperature indicator, the residual capacity displayed by the residual capacity indicator, and the fully charged capacity displayed by the fully charged capacity indicator in the charge mode;

DETAILED DESCRIPTION OF THE PREFERRED EMBODIMENT

Figure 1:
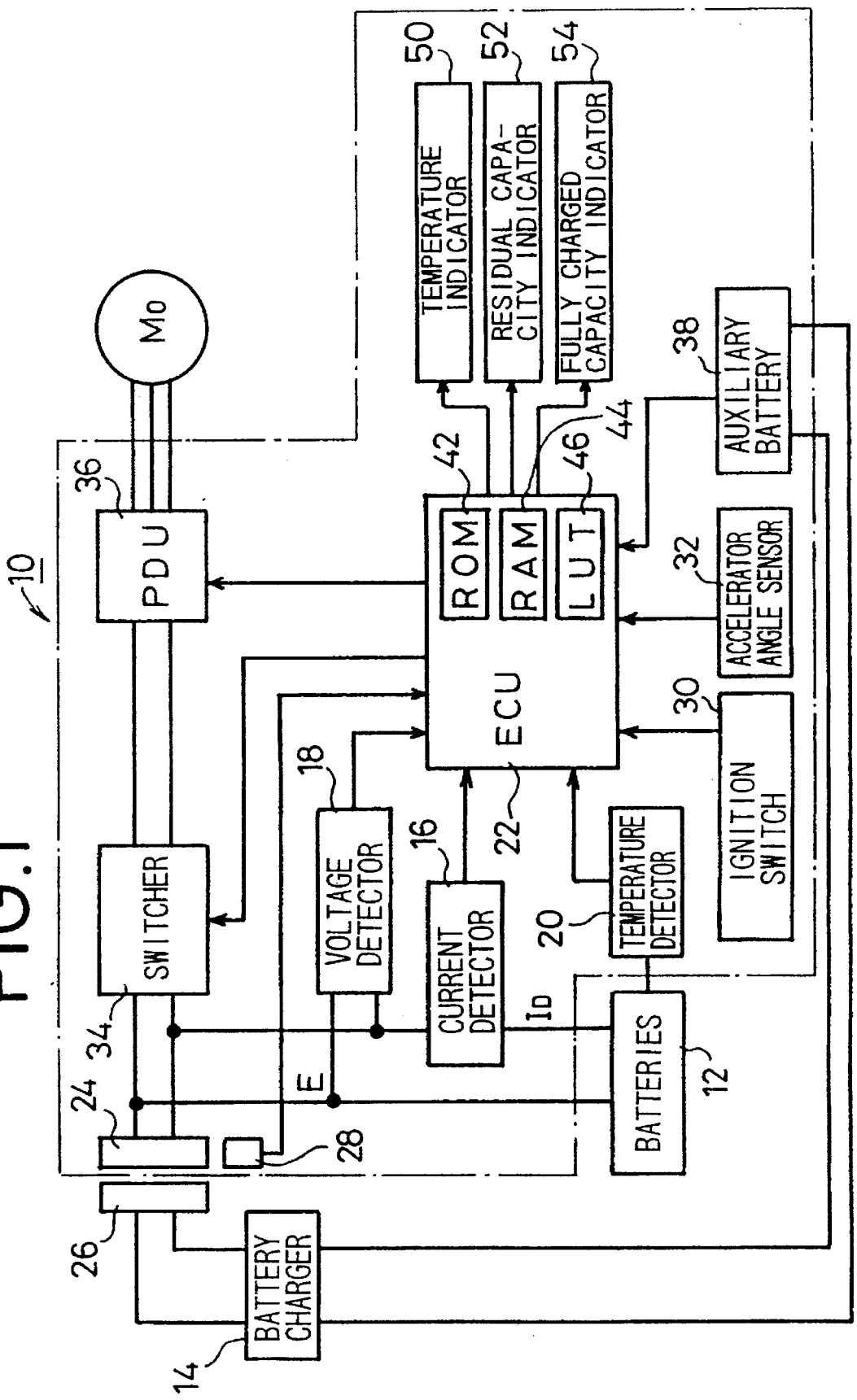
FIG. 1 is a block diagram of an apparatus for displaying the residual capacity of a battery for use on an electric vehicle.

As shown in FIG. 1, an apparatus 10 for displaying the residual capacity of a battery for use on an electric vehicle is associated with a plurality of series-connected batteries 12, and an electric motor Mo energizable by the batteries 12. A battery charger 14 can be connected at a desired time to the batteries 12.

The apparatus 10 has a current detector 16 for detecting discharge currents supplied from the batteries 12 to the motor Mo and other electric accessories and a charging current Ic supplied from the battery charger 14 to the batteries 12, a voltage detector 18 for detecting a voltage (battery voltage) E across the batteries 12, a temperature detector 20 for detecting the temperature of the batteries, e.g., the temperature of the electrolytic solution thereof, and an electronic control unit (ECU) 22 for calculating a residual capacity C of the batteries 12 based on detected data outputted from the current detector 16, the voltage detector 18, and the temperature detector 20.

The apparatus 10 also includes a charging connector 24 which can be joined to a charging connector 26 that is electrically connectable to the battery charger 14. The apparatus 10 also includes a connection sensor 28 for detecting whether the charging connector 26 is joined to the charging connector 24, an ignition switch 30, and an accelerator angle sensor 32 for detecting the angle through which an accelerator pedal is depressed. The ignition switch 30, which is so referred to after the ignition switch of an internal combustion engine, indicates the supply of electric energy to the motor Mo when an ignition key inserted into the ignition switch 30 is turned to a start position to start the motor Mo. The apparatus 10 also has a switcher 34 connected between junctions with the batteries 12 and the motor Mo, and a power drive unit (PDU) 36 for driving the motor Mo. The ECU 22 is energized by electric energy supplied from an auxiliary battery 38.

The ECU 22 has a read-only memory (ROM) 42 which stores a program for calculating the residual capacity C of the batteries 12, a random-access memory (RAM) 44 for temporarily storing data when the ECU 22 calculates the residual capacity C of the batteries 12, and a look-up table (LUT) memory 46 which is read by the ECU 22 when it calculates the residual capacity C of the batteries 12.

The apparatus 10 further includes a temperature indicator 50 composed of a linear array of spaced light-emitting elements such as light-emitting diodes for displaying information, as light emitted by the light-emitting elements, representing a battery temperature T detected by the temperature detector 20, a residual capacity indicator 52 composed of a linear array of spaced light-emitting elements such as light-emitting diodes for displaying information, as light emitted by the light-emitting elements, representing a residual capacity C of the batteries which is outputted from the ECU 22, and a fully charged capacity indicator 54 composed of a linear array of spaced light-emitting elements such as light-emitting diodes for displaying information, as light emitted by the light-emitting elements, representing a fully charged capacity $C_F$ of the batteries which is outputted from the ECU 22.

Figure 8:
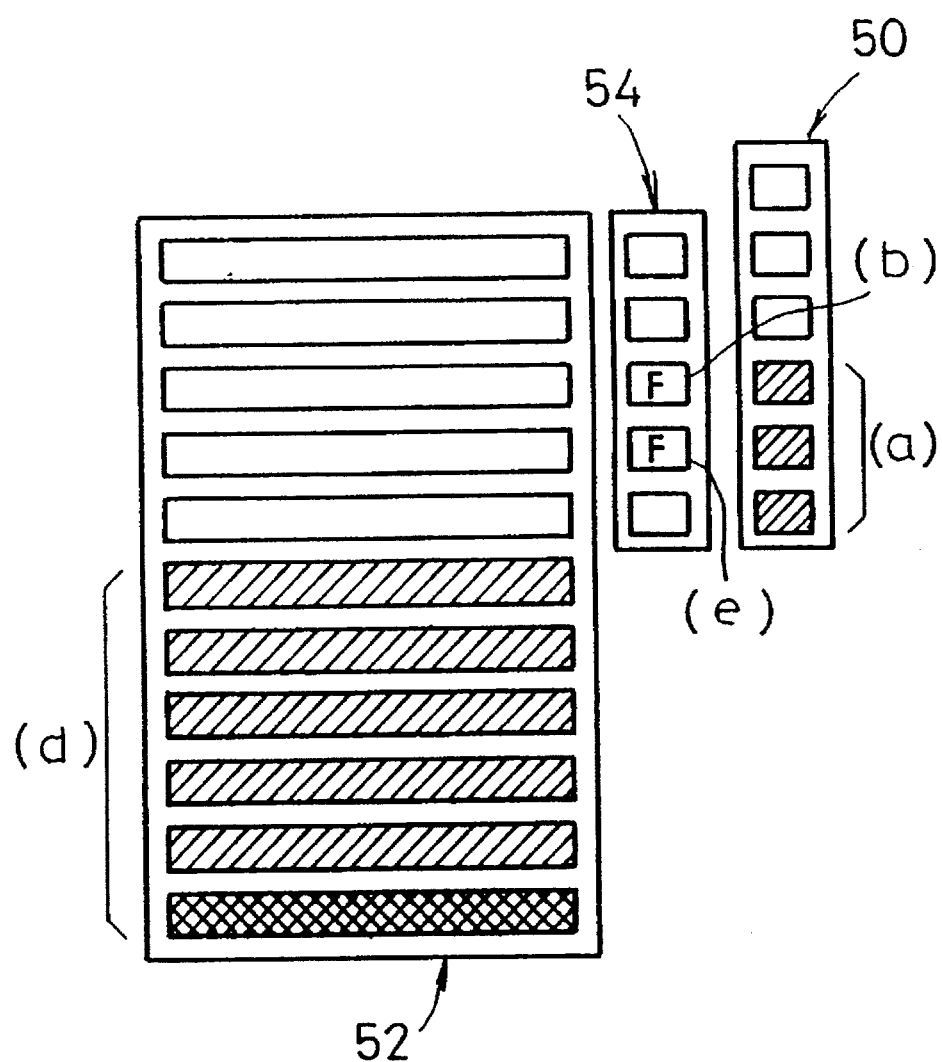
FIG. 8 is a view showing the relationship between the battery temperature displayed by a temperature indicator, the residual capacity displayed by a residual capacity indicator, and the fully charged capacity displayed by a fully charged capacity indicator in the discharge mode.

As shown in FIG. 8, the fully charged capacity indicator 54 and the residual capacity indicator 52 are positioned in association with each other such that the level difference between the position of the fully charged capacity $C_F$ displayed by the fully charged capacity indicator 54 and the position of the residual capacity C displayed by the residual capacity indicator 52 indicates a capacity consumed from the fully charged capacity $C_F$.

In FIG. 8, the fully charged capacity indicator 54 is also positioned in association with the temperature indicator 50 such that if the position of the fully charged capacity $C_F$ displayed by the fully charged capacity indicator 54 and the position of the battery temperature T displayed by the temperature indicator 50 are of the same level, then it indicates that the batteries 12 are not degraded by charging or discharging, and if the position of the fully charged capacity $C_F$ displayed by the fully charged capacity indicator 54 and the position of the battery temperature T displayed by the temperature indicator 50 are of different levels, then it indicates that the batteries 12 are degraded by charging or discharging, and the fully charged capacity $C_F$ is lowered.

The temperature indicator 50 and the residual capacity indicator 52 are also associated such that if the position of the residual capacity C displayed by the residual capacity indicator 52 and the position of the battery temperature T displayed by the temperature indicator 50 are not of the same level, then it indicates that the batteries 12 are suffering a combined degradation due to a charging-induced degradation and a discharging-induced degradation.

Figure 2:
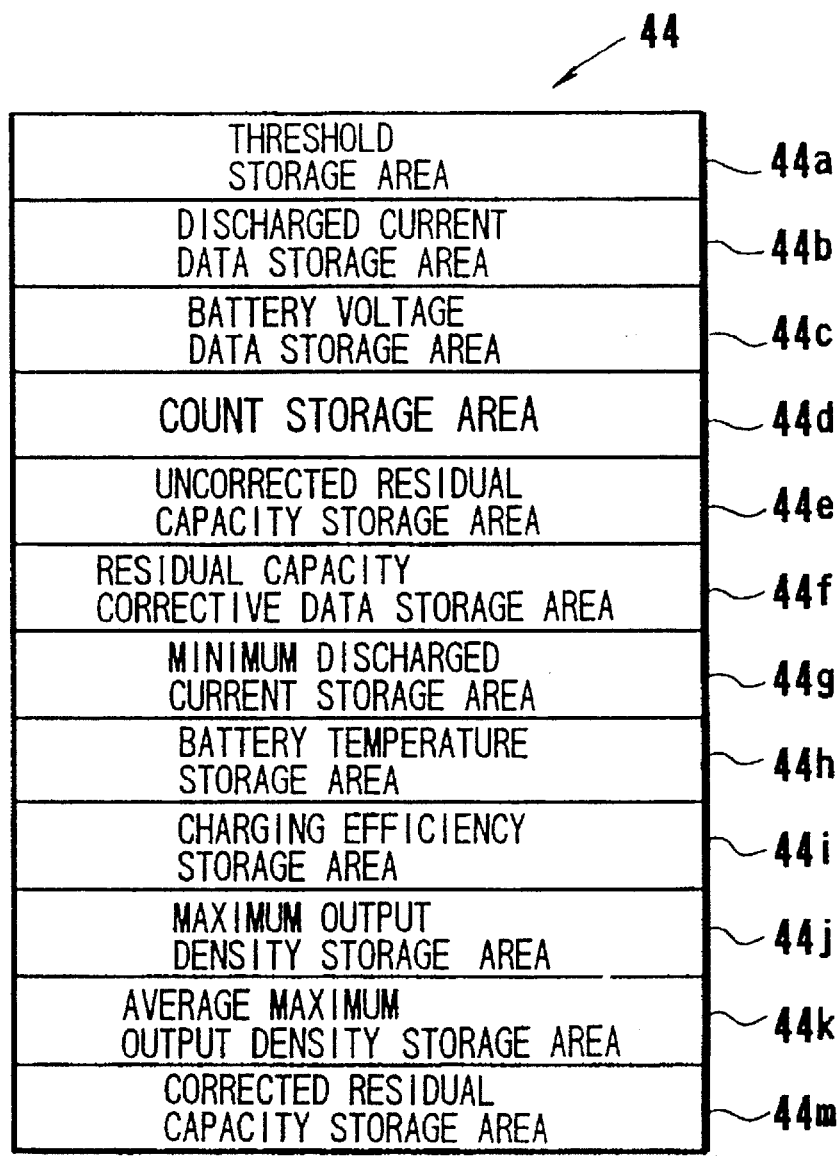
FIG. 2 is a diagram showing storage areas of a RAM in the apparatus shown in FIG. 1.

FIG. 2 shows storage areas of the RAM 44.

As shown in FIG. 2, the RAM 44 includes a threshold storage area 44a for storing thresholds that are read when data is determined by the ECU 22, a discharge current data storage area 44b for temporarily storing a discharge current $I_D$ that is read by the ECU 22 through the current detector 16, a battery voltage data storage area 44c for temporarily storing a battery voltage E that is read by the ECU 22 through the voltage detector 18, a count storage unit 44d for storing the number of times that the battery voltage E detected by the voltage detector 18 is lower than a threshold $E_1$ stored in the threshold storage area 44a in a discharge mode, an uncorrected residual capacity storage area 44e for storing an uncorrected residual capacity $C_I$, and a residual capacity corrective data storage area 44f for storing calculated data of a temperature corrective capacity $C_T$, a current corrective capacity $C_D$, a degradation corrective capacity $C_R$, and a temporary corrective capacity $C_{TM}$ for correcting the uncorrected residual capacity $C_I$ stored in the uncorrected residual capacity storage area 44e.

The RAM 44 also includes a minimum discharge current storage area 44g for storing a minimum discharge current $I_{min}$ of those discharge currents $I_D$ which are discharged when the battery voltage E is lower than the threshold $E_1$, a battery temperature storage area 44h for storing the battery temperature T detected by the temperature detector 20, a charging efficiency storage area 44i for storing a charging efficiency M determined by the ECU 22, a maximum output density storage area 44j for storing a maximum output density that is calculated by dividing the maximum output that can be produced from the batteries 12 by the weight of the batteries 12, an average maximum output density storage area 44k for storing an average maximum output density which represents an average value of a certain number of maximum output densities, and a corrected residual capacity storage area 44m for storing a corrected residual capacity $C_r$ which is calculated by correcting the uncorrected residual capacity $C_I$ with various corrective values.

FIGS. 3A, 3B through 6 show data of look-up tables stored in the LUT memory 46.

FIG. 3A shows a look-up table T1 from which to read the uncorrected residual capacity $C_I$ of the batteries 12 based on the battery voltage $E_{BB}$ per battery. FIG. 3B shows a look-up table T2 from which to read a corrective value (temperature corrective capacity $C_T$) for correcting a temperature-dependent change in the uncorrected residual capacity $C_I$ of the batteries 12 based on the battery temperature T detected by the temperature detector 20.

Figure 4A:
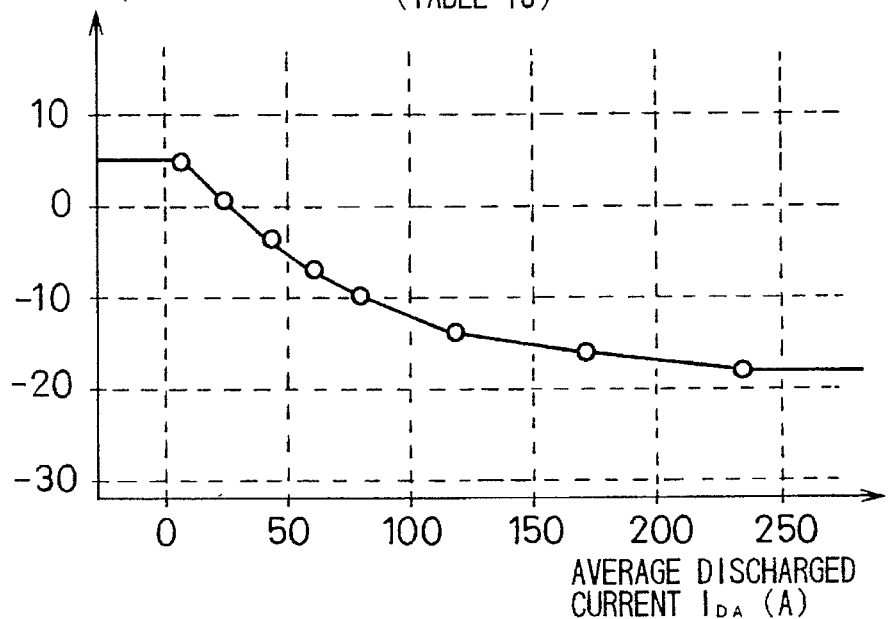
FIG. 4A is a graph showing a look-up table stored in the LUT memory which represents the relationship between the average discharge current in one minute and the current corrective capacity.
Figure 4B:
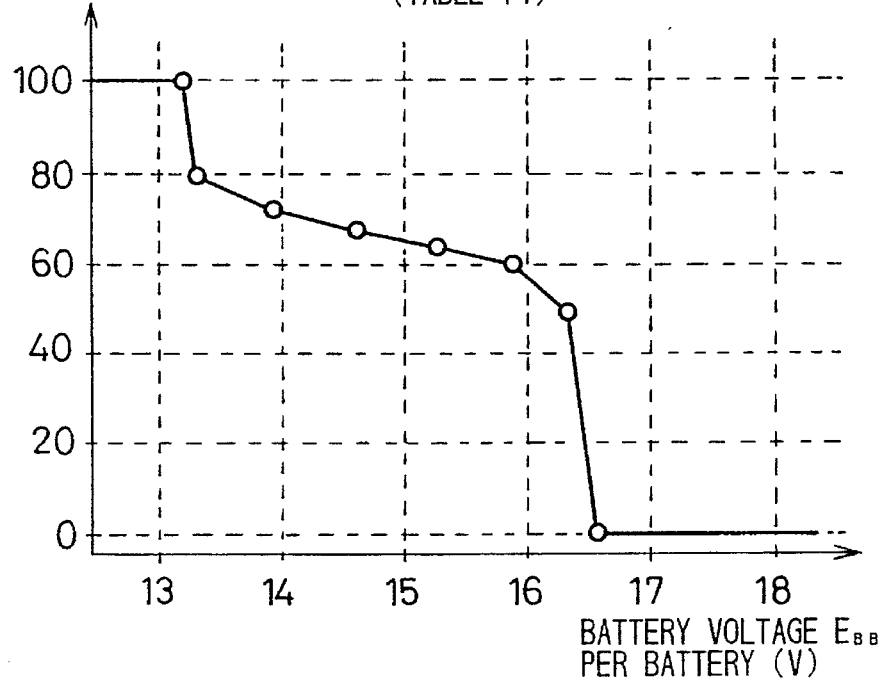
FIG. 4B is a graph showing a look-up table stored in the LUT memory which represents the relationship between the voltage per battery and the charging efficiency.

FIG. 4A shows a look-up table T3 from which to read a corrective value (current corrective value $C_D$) for correcting the uncorrected residual capacity $C_I$ of the batteries 12 based on an average discharge current $I_{DA}$ in one minute. FIG. 4B shows a look-up table T4 from which to read the proportion (charging efficiency M) of a current which is converted into the uncorrected residual capacity $C_I$ in the batteries 12, of a supplied charging current $I_c$ based on the battery voltage $E_{BB}$, in a charge mode in which the charging current $I_c$ is supplied from the battery charger 14 to the batteries 12.

Figure 5A:
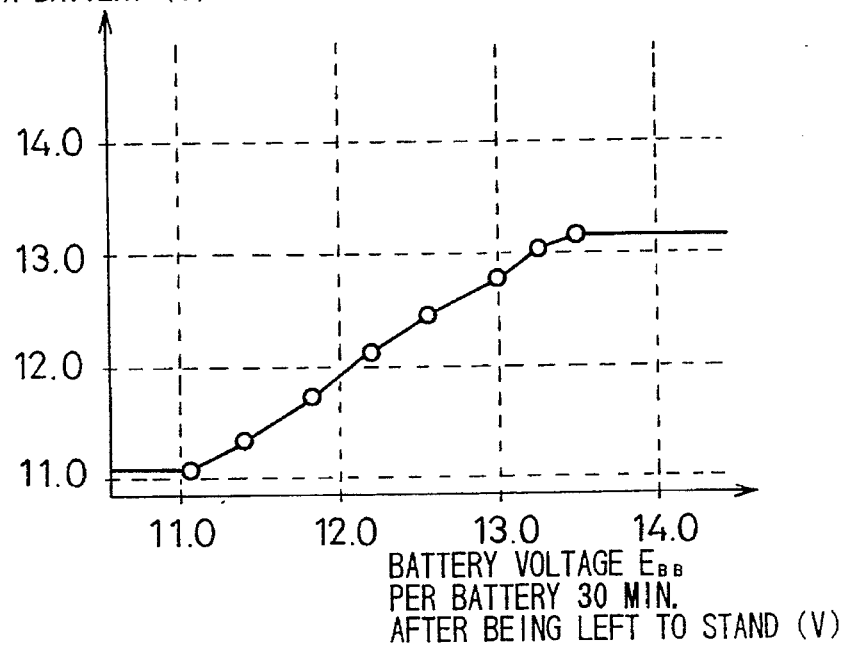
FIG. 5A is a graph showing a look-up table stored in the LUT memory which represents the relationship between the voltage per battery 30 minutes after the battery has been left to stand and the voltage per battery which is predicted when the battery is stable.
Figure 5B:
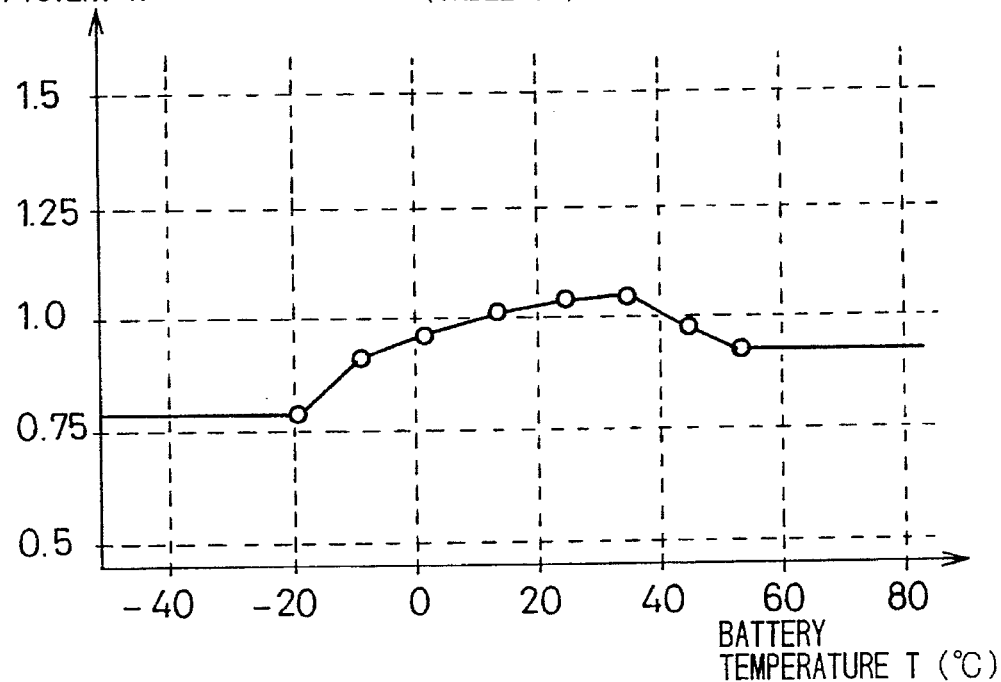
FIG. 5B is a graph showing a look-up table stored in the LUT memory which represents the relationship between the battery temperature and the temperature corrective coefficient.

FIG. 5A shows a look-up table T5 from which to read a stable battery voltage $E_{BB}$ predicted after elapse of a given period of time, based on the battery voltage $E_{BB}$ after the battery has been left to stand for 30 minutes. FIG. 5B is a look-up table T6 from which to read a temperature corrective coefficient X of a charging rate Y based on the battery temperature T. The charging rate Y represents the difference between the rated capacity $C_{F1}$ and the present corrected residual capacity $C_r$ of the batteries 12.

FIG. 6 shows a look-up table T7 from which to read the fully charged capacity $C_F$ of the batteries 12 based on the battery temperature T.

A process of detecting and displaying the corrected residual capacity $C_r$ of the batteries 12 in the discharge mode in which currents are supplied from the batteries 12 to the motor Mo and the electric accessories including an air-conditioning unit on the electric vehicle will be described below with reference to FIG. 7.

When an ignition key inserted in the ignition switch 30 is turned to a position to start the motor Mo by the driver, the ECU 22 determines that the batteries 12 are in the discharge mode based on a signal outputted from the ignition switch 30 in a step S10. The ECU 22 applies a signal to the switcher 34 to connect the batteries 12 and the PDU 36 to each other. The ECU 22 also applies a motor drive signal to the PDU 36, allowing a battery voltage E to be applied through the switcher 34 and the PDU 36 to the motor Mo, which starts rotating.

When the motor Mo starts rotating, the ECU 22 reads a battery temperature T detected by the temperature sensor 20, displays the battery temperature T on the temperature indicator 50 (see FIG. 8 at (a)), reads a fully charged capacity $C_F$ from the look-up table T7 (see FIG. 6) stored in the LUT memory 46 based on the battery temperature T, and displays the fully charged capacity $C_F$ on the fully charged capacity indicator 54 (see FIG. 8 at (b)) in a step S11.

Then, the battery voltage E detected by the voltage detector 18 is sampled at predetermined sampling times, e.g., a period of 100 msec., and the sampled battery voltage E is read every minute by the ECU 22 in a step S12. Specifically, 600 data per minute of the battery voltage E are read by the ECU 22, and stored in the battery voltage data storage area 44c of the RAM 44. At the same time, a discharge current $I_D$ supplied from the batteries 12 to the motor Mo and detected by the current detector 16 is sampled at predetermined sampling times, e.g., a period of 100 msec., and 600 data per minute of the discharge current $I_D$ are read by the ECU 22, and stored in the discharge current data storage area 44b of the RAM 44 in the step S12. Then, the ECU 22 calculates an average battery voltage $E_A$ of the 600 data per minute of the battery voltage E which are stored in the battery voltage data storage area 44c, and calculates a battery voltage $E_{BB}$ per battery. Based on the calculated battery voltage $E_{BB}$, the ECU 22 reads an initial value of the uncorrected residual capacity $C_t$ of the batteries 12 in the discharge mode from the look-up table T1 stored in the LUT memory 46, and stores the read initial value in the uncorrected residual capacity storage area 44e in a step S14.

The ECU 22 counts those battery voltages E of the 600 data which are lower than the first threshold $E_1$ stored in the threshold storage area 44a, and stores the count in the count storage area 44d in a step S16. The ECU 22 also extracts discharge currents $I_D$ when those battery voltages E are lower than the first threshold $E_1$, and extracts a minimum discharge current $I_{min}$ of the extracted discharge current $I_D$ in a step S18. The ECU 22 stores the extracted minimum discharge current $I_{min}$ in the minimum discharge current storage area 44g.

Figure 9:
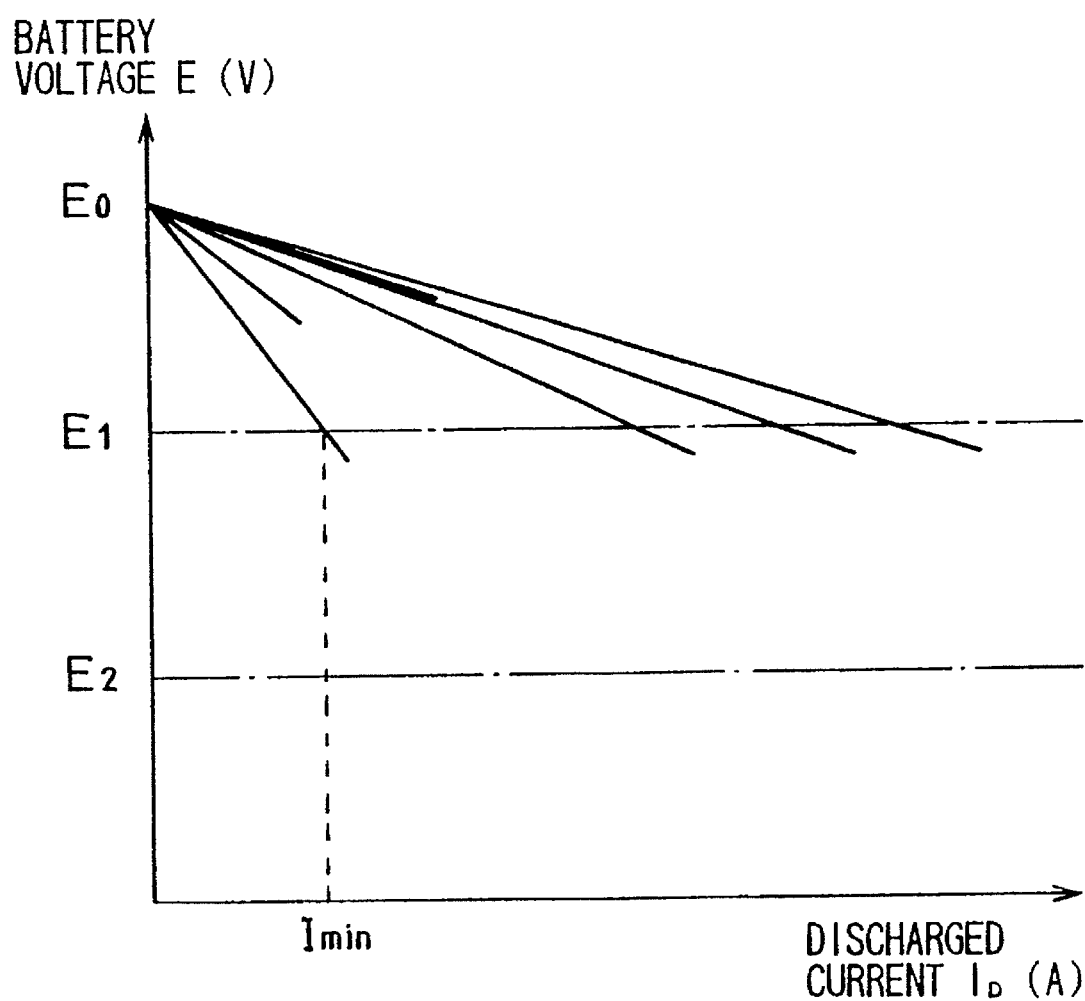
FIG. 9 is a diagram showing the relationship between the discharge current and the voltage across the batteries which are being discharged in the discharge mode.

As shown in FIG. 9, the battery voltage E varies depending on the discharge current $I_D$ such that the battery voltage E of a more degraded battery 12 drops to a larger degree with a smaller discharge current $I_D$.

Then, the ECU 22 reads the 600 data of the discharge current $I_D$ read in the step S12 and stored in the discharge current data storage area 44b, adds the 600 data, calculates an average discharge current $I_{DA}$ for one minute from the added 600 data of the discharge current $I_D$ in a step S20. The ECU 22 integrates the average discharge current $I_{DA}$, thereby producing a discharge quantity $\Delta C$ of electric energy for one minute in a step S22.

The ECU 22 subtracts the discharge quantity $\Delta C$ from the initial value of the uncorrected residual capacity $C_t$, and updates the uncorrected residual capacity $C_t$ stored in the uncorrected residual capacity storage area 44e into the uncorrected residual capacity $C_t$ from which the discharge quantity $\Delta C$ has been subtracted according to the following equation (1) in a step S24:

$$C_t \leftarrow C_t - \Delta C. \tag{1}$$

The ECU 22 thus updates the uncorrected residual capacity $C_t$ every minute. The ECU 22 determines whether or not the updated uncorrected residual capacity $C_t$ is equal to or smaller than a minimum residual capacity $C_{min}$ stored in the threshold storage area 44a in a step S26. If the updated uncorrected residual capacity $C_t$ is equal to or smaller than the minimum residual capacity $C_{min}$, then the ECU 22 updates the uncorrected residual capacity $C_t$ stored in the uncorrected residual capacity storage area 44e into the minimum residual capacity $C_{min}$ in a step S28.

If the updated uncorrected residual capacity $C_t$ is neither equal to nor smaller than the minimum residual capacity $C_{min}$, then the ECU 22 determines whether or not the updated uncorrected residual capacity $C_t$ is equal to or greater than a maximum residual capacity $C_{max}$ stored in the threshold storage area 44a in a step S30. If the updated uncorrected residual capacity $C_t$ is equal to or greater than the maximum residual capacity $C_{max}$, then the ECU 22 updates the uncorrected residual capacity $C_t$ stored in the uncorrected residual capacity storage area 44e into the maximum residual capacity $C_{max}$ in a step S32.

The ECU 22 reads a battery temperature T detected by the temperature detector 20, reads a temperature-dependent corrective value (temperature corrective capacity $C_T$) for correcting the uncorrected residual capacity $C_t$ from the look-up table T2 stored in the LUT memory 46, and stores the read temperature corrective capacity $C_T$ in the residual capacity corrective data storage area 44f in a step S34.

Based on the average discharge current $I_{DA}$ calculated in the step S20, the ECU 22 reads a corrective value (current corrective value $C_D$) for correcting the uncorrected residual capacity $C_t$ from the look-up table T3 stored in the LUT memory 46, and stores the read current corrective value $C_D$ in the residual capacity corrective data storage area 44f in a step S36.

Based on a corrective value (degradation corrective capacity $C_R$) for correcting a degradation-dependent variation in a rated capacity $C_{F1}$ of the batteries 12 and an integrated value of discharge quantities $\Delta C$, the ECU 22 calculates a corrective value (temporary corrective capacity $C_{TM}$) for correcting an error of the residual capacity C which is produced due to an integration error of the discharge quantities $\Delta C$ when the residual capacity C is calculated, according to a degradation corrective capacity calculating subroutine (described later on), and stores the calculated temporary corrective capacity $C_{TM}$ in the residual capacity corrective data storage area 44f in a step S38. The temporary corrective capacity $C_{TM}$ is also used when charging currents $I_c$ are integrated to calculate an uncorrected residual capacity $C_t$ in a charge mode.

The ECU 22 corrects the uncorrected residual capacity $C_t$ with the temperature corrective capacity $C_T$, the current corrective value CD, the degradation corrective capacity $C_R$, and the temporary corrective capacity $C_{TM}$, thereby calculating a corrected residual capacity $C_r$ according to the equation (2), given below, in a step S40.

$$C_r \leftarrow C_t + C_T + C_D - C_R - C_{TM}. \tag{2}$$

The ECU 22 then displays the corrected residual capacity $C_r$ on the residual capacity indicator 52 (see FIG. 8 at (d)) in a step S42.

The degradation corrective capacity calculating subroutine in the step S38 will be described below with reference to FIGS. 10 through 14.

Figure 10:
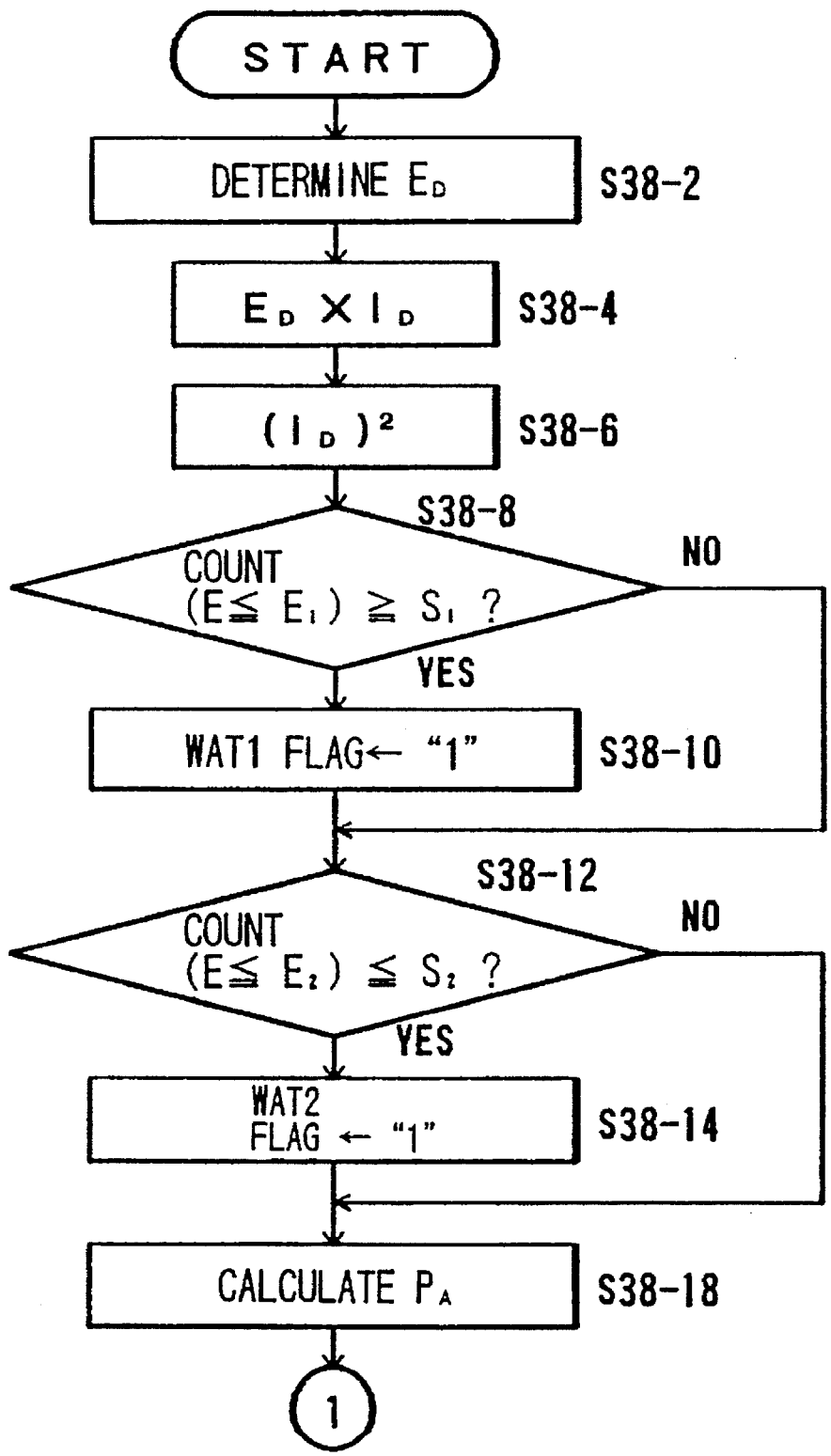
FIGS. 10 through 14 are flowcharts of a subroutine for calculating a degradation corrective value in the main flowchart shown in FIG. 7.

As shown in FIG. 10, the ECU 22 adds the 600 data of the battery voltage E read in the step S12 and stored in the battery voltage data storage area 44c, thereby determining a sum battery voltage $E_D$ in a step S38-2. The ECU 22 multiplies the sum battery voltage $E_D$ by the sum of the added 600 data of the discharge current $I_D$ (sum discharge current ID) from the step S20 ($E_D \times I_D$) in a step S38-4. The ECU 22 squares the sum of the added 600 data of the discharge current $I_D$ in a step S38-6.

The ECU 22 determines whether or not the count determined in the step S16 is equal to or greater than a predetermined value $S_1$ in a step S38-8. If the count is equal to or greater than the predetermined value $S_1$, then the ECU 22 sets a WAT1 flag to "1" in a step S38-10. The ECU 22 also determines whether or not the count or the number of those battery voltages E of the 600 data, read in one minute in the step S12, which are lower than a second threshold $E_2$ stored in the threshold storage area 44a, is equal to or smaller than a predetermined value $S_2$ in a step S38-12. If the count is equal to or smaller than the predetermined value $S_2$, then the ECU 22 sets a WAT2 flag to "1" in a step S38-14.

If the count determined in the step S16 is neither equal to nor greater than the predetermined value $S_1$ in the step S38-8, then control jumps to the step S38-12 without setting the WAT1 flat to "1" in the step S38-10. If the count is neither equal to nor smaller than the predetermined value $S_2$ in the step S38-12, then control jumps to a step S38-18 without setting the WAT2 flat to "1" in the step S38-14.

In the step S38-18, the ECU 22 calculates an average maximum output density $P_A$.

More specifically, the ECU 22 determines a linear formula indicative of the relationship between the sum battery voltage $E_D$ and the sum discharge current $I_D$ according to a method of least squares using the sum battery $E_D$ calculated in the step S38-2, the product of the sum battery voltage $E_D$ and the sum discharge current $I_D$ calculated in the step S38-4, and the square of the sum discharge current $I_D$ calculated in the step S38-6, calculates a maximum output $P_{max}$ from the batteries 12 according to the determined linear formula, divides the maximum output $P_{max}$ by the weight of the batteries 12 into a maximum output density, and stores the maximum output density in the maximum output density storage area 44j.

The maximum output density is determined according to the linear formula: $(E_0/2) \times (I_s/2)$ where $E_0$ is the value of the battery voltage $E_D$ at the time the discharge current $I_D$ is zero and $I_s$ is the value of the discharge current $I_D$ when the battery voltage $E_D$ is zero.

The ECU 22 reads N maximum output densities, e.g., five maximum output densities, including the maximum output density, in the past from the maximum output density storage area 44j, calculates an average of the read maximum output densities as an average maximum output density $P_A$, and stores the average maximum output density $P_A$ in the average maximum output density storage area 44k.

Figure 11:
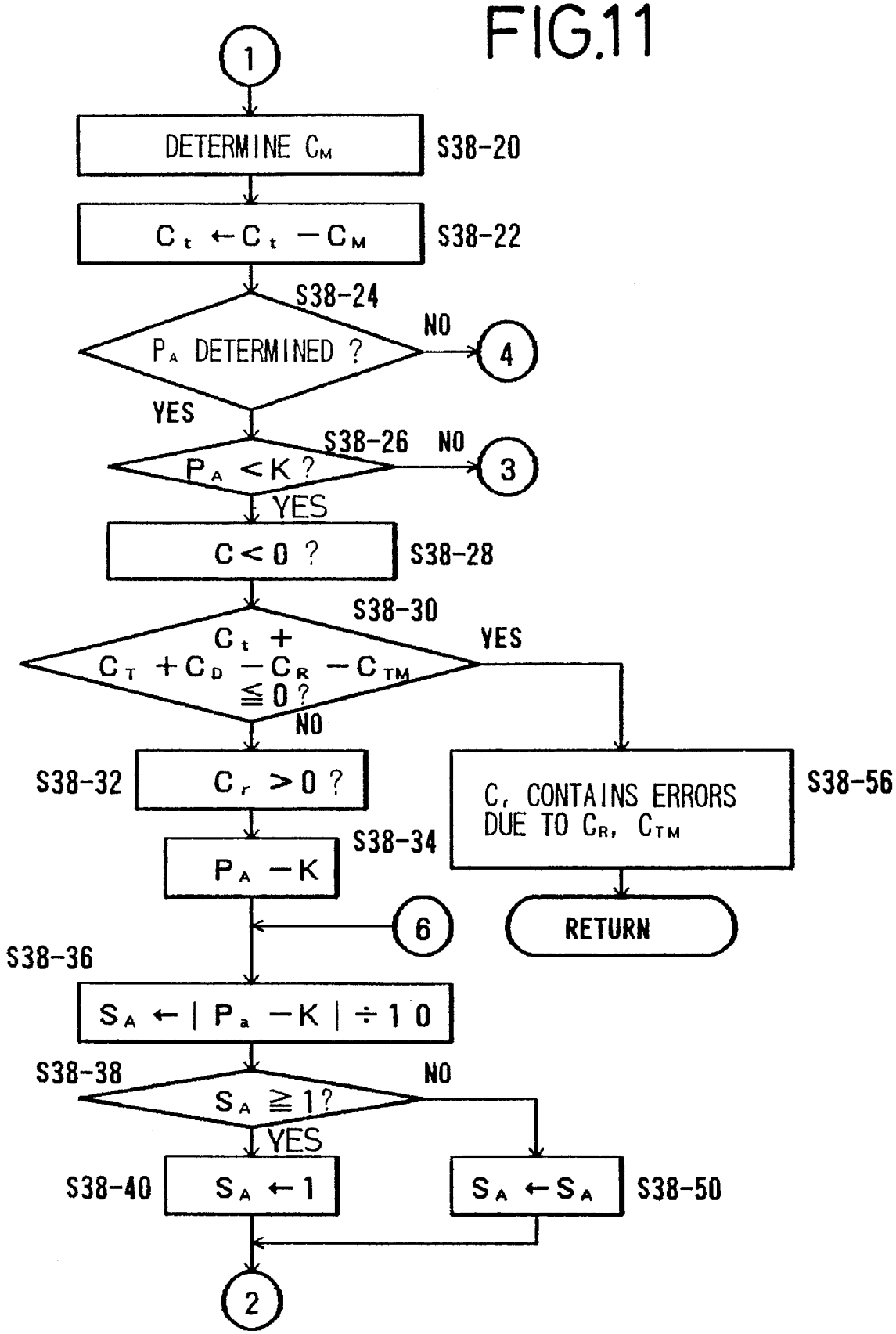
Figure 12:
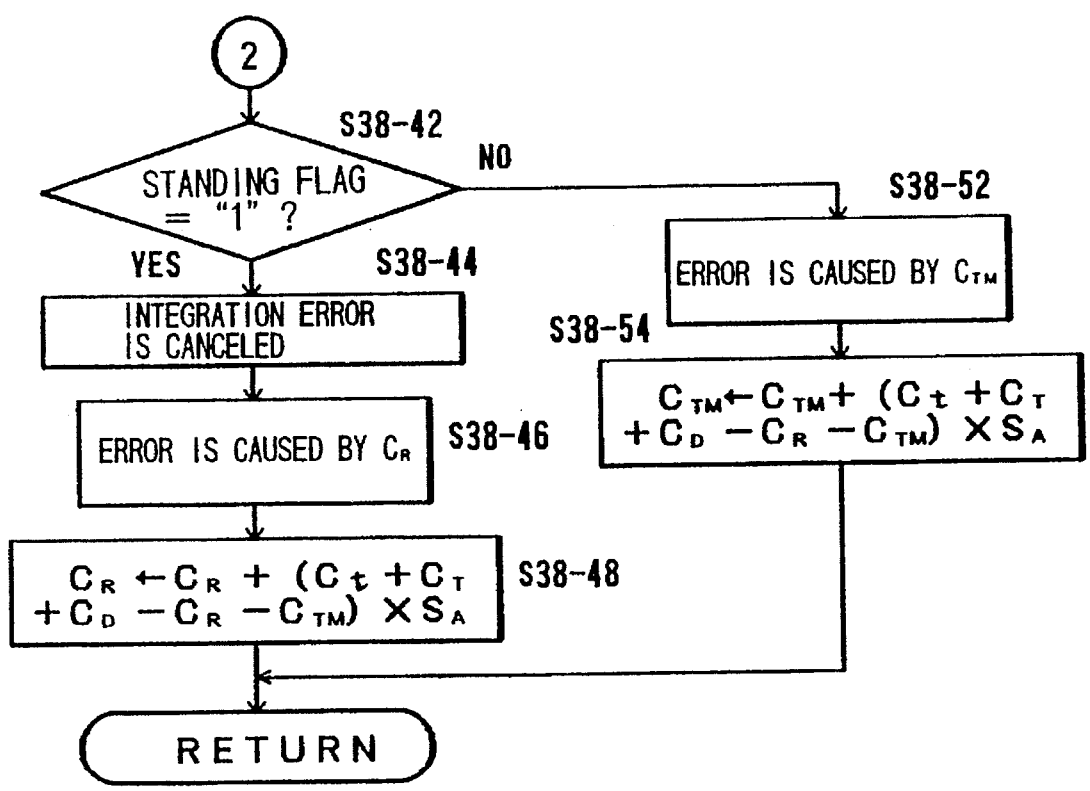

Then, as shown in FIG. 11, the ECU 22 integrates discharge quantities $\Delta C$ which are calculated in the step S22 to produce an integrated discharge current $C_M$ in a step S38-20. The ECU 22 subtracts the integrated discharge capacity $C_M$ from the initial value of the uncorrected residual capacity $C_i$ which is determined and stored in the uncorrected residual capacity storage area 44e, thus determining an uncorrected residual capacity $C_i$ which is stored in the uncorrected residual capacity storage area 44e in a step S38-22.

Thereafter, the ECU 22 determines whether an average maximum output density $P_A$ has been determined or not in a step S38-24. If determined, then the ECU 22 determines whether or not the average maximum output density $P_A$ is smaller than a threshold K that is stored in the threshold storage area 44a in a step S38-26. The threshold K serves to determine whether the virtual residual capacity C of the batteries 12 is "0" or not. If the average maximum output density $P_A$ is smaller than the threshold K in the step S38-26, then the ECU 22 determines that the residual capacity C of the batteries 12 is essentially "0" in a step S38-28.

Then, the ECU 22 determines whether or not the corrected residual capacity $C_r$, which has been produced by correcting the uncorrected residual capacity $C_i$ from the step S38-22 with the temperature corrective capacity $C_T$, the current corrective value $C_D$, the degradation corrective capacity $C_R$, and the temporary corrective capacity $C_{TM}$, is equal to or smaller than "0" according to the following formula (3) in a step S38-30:

$$C_i + C_T + C_D - C_R - C_{TM} \leq 0. \tag{3}$$

The values of the degradation corrective capacity $C_R$ and the temporary corrective capacity $C_{TM}$ which are used in the calculation of the formula (3) are values in a previous cycle which are stored in the residual capacity corrective data storage area 44f.

If the corrected residual capacity $C_r$ is neither equal to nor smaller than "0" in the step S38-30, then the ECU 22 determines that the corrected residual capacity $C_r$ is greater than "0" in a step S38-32. At this time, even though the virtual residual capacity C has been determined as being greater than "0" based on the average maximum output density $P_A$ in the step S38-28, the corrected residual capacity $C_r$ produced by integrating discharge quantities $\Delta C$ is determined as being greater than "0".

The ECU 22 then calculates the difference between the average maximum output density $P_A$ and the threshold K in a step S38-34, calculates a degraded quantity calculating coefficient $S_A$ by dividing the calculated difference by a predetermined value, e.g., "10", in a step S38-36, and determines whether or not the degraded quantity calculating coefficient $S_A$ is equal to or greater than "1" in a step S38-38.

If the degraded quantity calculating coefficient $S_A$ is equal to or greater than "1", i.e., if the average maximum output density $P_A$ is much smaller than the threshold K, then the ECU 22 sets the degraded quantity calculating coefficient $S_A$ to a maximum value of "1" in a step S38-40. Thereafter, the ECU 22 reads a standing flag set in a standing mode in which the batteries 12 are left to stand (described later on), and determines whether the standing flag is "1" or not in a step S38-42 (see FIG. 12).

If the standing flag is "1", then the ECU 22 determines an integration error produced by the integration of discharge currents $I_D$ in the calculation of the discharge quantity $\Delta C$ in the discharge mode, as being canceled in a step S38-44. Then, the ECU 22 determines the corrected residual capacity $C_r$ produced by the integration of discharge quantities $\Delta C$ as containing an error due to degradation of the batteries 12 in a step S38-46, and calculates a degradation corrective capacity $C_R$ for the batteries 12 according to the following equation (4) in a step S38-48:

$$C_R \leftarrow C_R + (C_i + C_T + C_D - C_R - C_{TM}) \times S_A. \tag{4}$$

The ECU 22 updates a previous degradation corrective capacity $C_R$ stored in the residual capacity corrective data storage area 44f into the calculated degradation corrective capacity $C_R$, and corrects the fully charged capacity $C_F$ displayed on the fully charged capacity indicator 54 in the step S11 with the updated degradation corrective capacity $C_R$ (see FIG. 8 at (e)). Then, control returns to the main routine shown in FIG. 7. The fully charged capacity $C_F$ is corrected according to the correction of the residual capacity.

If the degraded quantity calculating coefficient $S_A$ is neither equal to nor greater than "1", as determined in step S38-38, the ECU 22 sets the degraded quantity calculating coefficient $S_A$ to the value calculated in the step S38-36 in a step S38-50, and then control goes to the step S38-42.

If the standing flag is not "1" in the step S38-42, then the ECU 22 determines an integration error produced by the integration of discharge currents $I_D$ in the calculation of the discharge quantity $\Delta C$, as being not canceled, i.e., determines an error due to the temporary corrective capacity $C_{TM}$ being contained in the corrected residual capacity $C_r$ in a step S38-52, calculates the temporary corrective capacity $C_{TM}$ according to the following equation (5) in a step S38-54:

$$C_{TM} \leftarrow C_{TM} + (C_i + C_T + C_D - C_R - C_{TM}) \times S_A. \tag{5}$$

The ECU 22 updates a previous temporary corrective capacity $C_{TM}$ stored in the residual capacity corrective data storage area 44f into the calculated temporary corrective capacity $C_{TM}$. Then, control returns to the main routine shown in FIG. 7.

As described above, when the corrected residual capacity $C_r$ is greater than "0" regardless of the fact that the average maximum output density $P_A$ is smaller than the threshold K, i.e., the virtual residual capacity C is smaller than "0", the ECU 22 determines whether an error contained in the corrected residual capacity $C_r$ is caused by the degradation corrective capacity $C_R$ or the temporary corrective capacity $C_{TM}$ by determining whether the standing flag is "1" or not, and calculates and updates the degradation corrective capacity $C_R$ or the temporary corrective capacity $C_{TM}$ based on the determined result.

The standing flag is set in the standing mode (described later on). When the standing flag is set to "1", an integration error so far is canceled.

If the corrected residual capacity $C_r$ is equal to or smaller than "0" in the step S38-30, then since the virtual residual capacity C is smaller than "0" and the corrected residual capacity $C_r$ is smaller than "0", the ECU 22 determines that the corrected residual capacity $C_r$ does not contain errors due to the degradation corrective capacity $C_R$ and the temporary corrective capacity $C_{TM}$ in a step S38-56. Thereafter, control returns to the main routine shown in FIG. 7.

Figure 13:
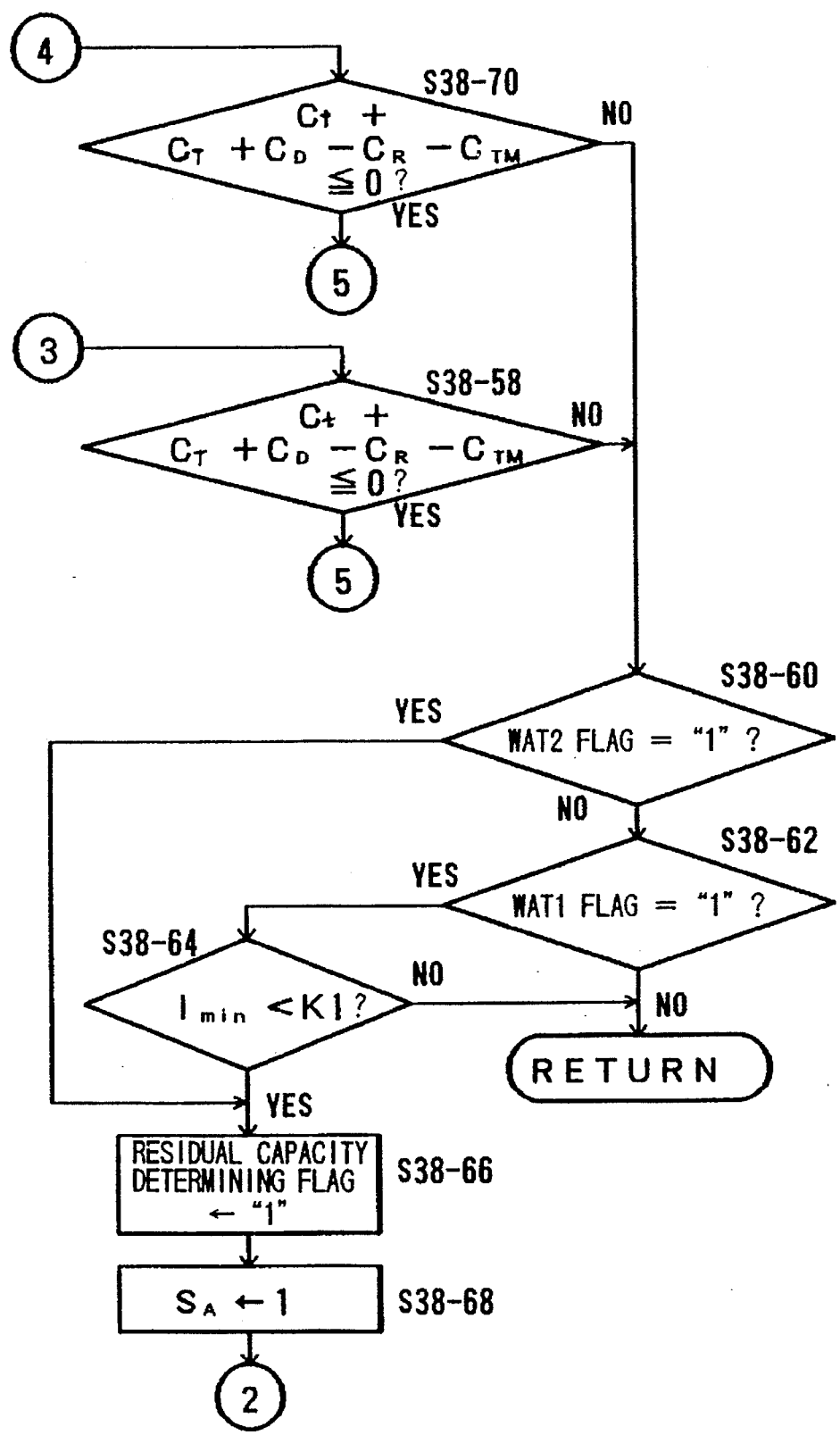

If the average maximum output density $P_A$ is not smaller than the threshold K in the step S38-26, then the ECU 22 determines whether or not the corrected residual capacity $C_r$ is equal to or smaller than "0" according to the formula (3) in a step S38-58 (see FIG. 13). If the corrected residual capacity $C_r$ is neither equal to nor smaller than "0", then the ECU 22 determines whether the WAT2 flag is "1" or not in a step S38-60. If the WAT2 flag is not "1", then the ECU 22 determines whether the WAT1 flag is "1" or not in a step S38-62. If the WAT1 flag is not "1", then the ECU 22 determines that the virtual residual capacity C is greater than "0", the corrected residual capacity $C_r$ obtained based on the integration of discharge quantities $\Delta C$ is greater than "0", and that the virtual residual capacity C and the corrected residual capacity $C_r$ obtained based on the integration of discharge quantities $\Delta C$ agree with each other, and the batteries 12 are in a normal condition in which the residual capacity C is sufficiently present. Thereafter, control returns to the main routine shown in FIG. 7.

If the WAT1 flag is "1" in the step S38-62, then the ECU 22 determines whether the minimum discharge current $I_{min}$ extracted in the step S18 is smaller than a threshold K1 for determining a reduction in the residual capacity C or not in a step S38-64. If the minimum discharge current $I_{min}$ is not smaller than the threshold K1, then the ECU 22 determines that the batteries 12 are in a normal condition in which their service life has not elapsed yet due to degradation. Thereafter, control returns to the main routine shown in FIG. 7.

If the minimum discharge current $I_{min}$ is smaller than the threshold K1, then the ECU 22 sets a residual capacity determining flag to "1" for determining whether a residual capacity is present or not in a step S38-66. Thereafter, the ECU 22 sets the degraded quantity calculating coefficient $S_A$ to a maximum value of "1" in a step S38-66, and then calculates the degradation corrective capacity $C_R$ or the temporary corrective capacity $C_{TM}$ in the steps following the step S38-42.

If the WAT2 flag is "1" in the step S38-60, then the ECU 22 determines that the residual capacity C is insufficient, and then calculates the degradation corrective capacity $C_R$ or the temporary corrective capacity $C_{TM}$ following the step S38-66.

If an average maximum output density $P_A$ has not been determined in the step S38-24, the ECU 22 determines whether or not the corrected residual capacity $C_r$ is equal to or smaller than "0" according to the formula (3) in a step S38-70. If the corrected residual capacity $C_r$ is neither equal to nor smaller than "0", then the ECU 22 determines that no average maximum output density $P_A$ has been determined, but the residual capacity C is sufficient, and executes the step S38-60 and following steps.

Figure 14:
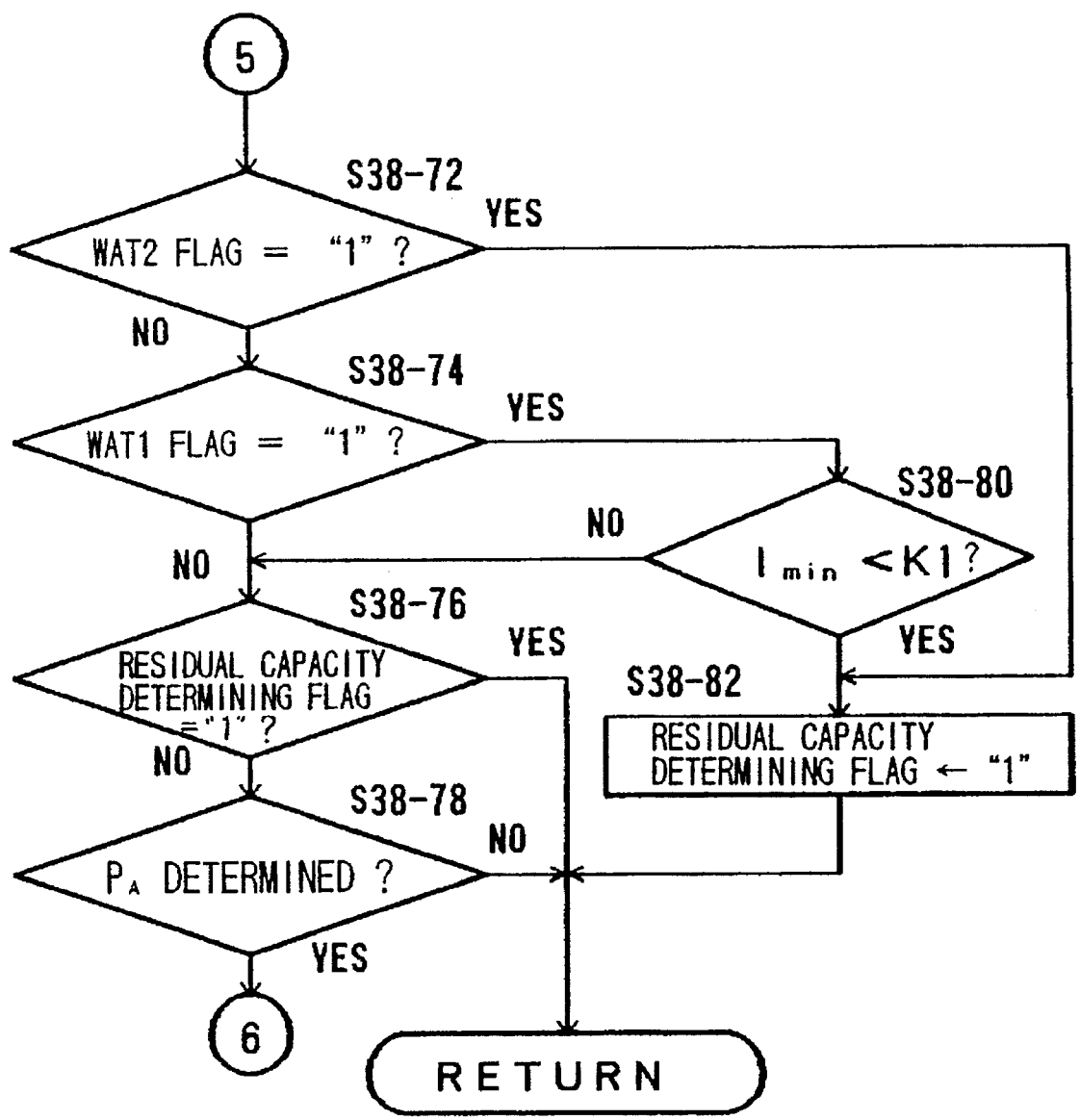

If the corrected residual capacity $C_r$ is equal to or smaller than "0" in the steps S38-58, S38-70, then the ECU 22 determines that the corrected residual capacity $C_r$ which is corrected with the temperature corrective capacity $C_T$, the current corrective value $C_D$, the degradation corrective capacity $C_R$, and the temporary corrective capacity $C_{TM}$ is smaller than "0", and determines whether the WAT2 flag is "1" or not in a step S38-72 (see FIG. 14). If the WAT2 flag is not "1", then the ECU 12 determines whether the WAT1 flag is "1" or not in a step S38-74. If the WAT1 flag is not "1", then the ECU 12 determines whether the residual capacity determining flag is "1" or not in a step S38-76. If the residual capacity determining flag is not "1", then the ECU 12 determines whether an average maximum output density $P_A$ has been determined or not in a step S38-78. If an average maximum output density $P_A$ has been determined, then the ECU 22 determines that the corrected residual capacity $C_r$ obtained based on the integration of discharge quantities $\Delta C$ is smaller than "0", but the virtual residual capacity C is greater than "0". The ECU 22 executes the step S38-36 and following steps to calculate the degradation corrective capacity $C_R$ or the temporary corrective capacity $C_{TM}$.

Figure 15:
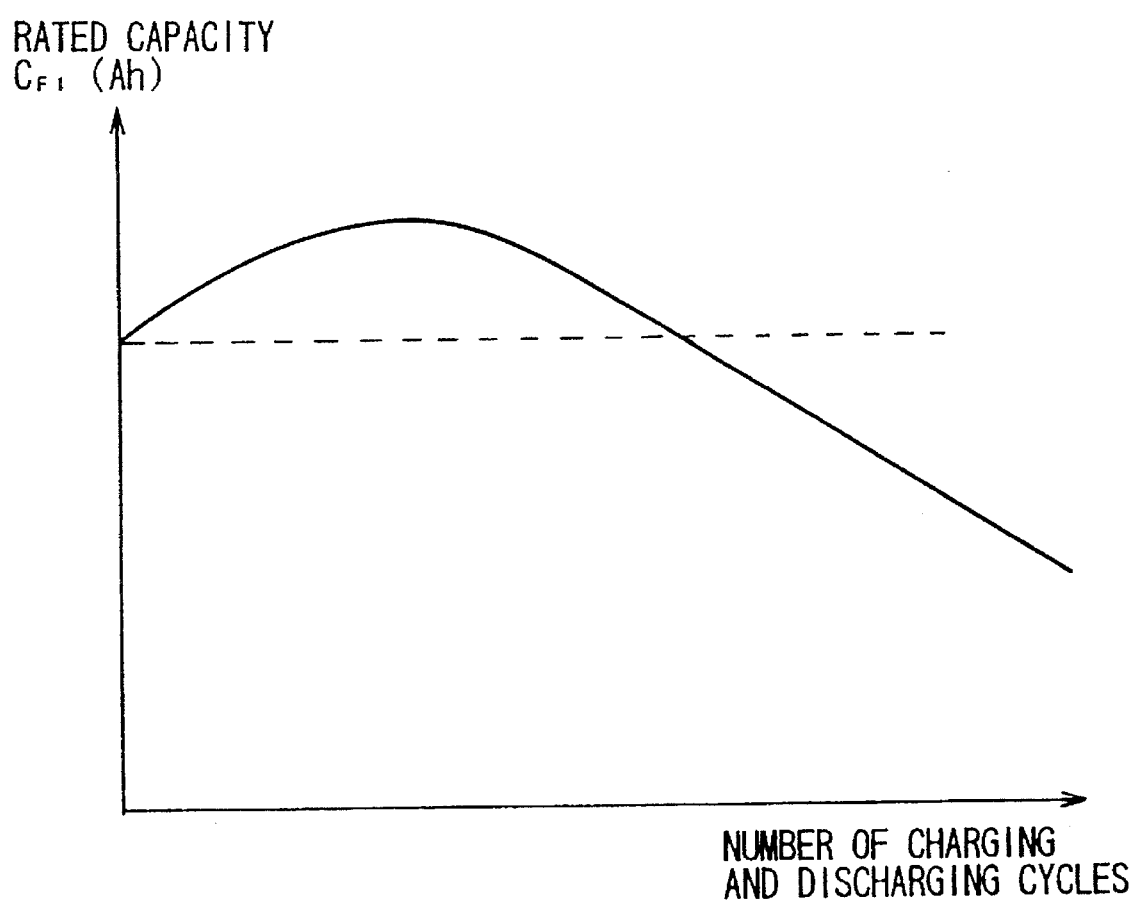
FIG. 15 is a graph illustrative of how the rated capacity of the batteries varies with respect to the number of charging and discharging cycles of the batteries.

As shown in FIG. 15, the rated capacity $C_{F1}$ of the batteries 12 increases when the number of charging cycles increases, and then decreases after a predetermined number of charging cycles have been reached. Therefore, the degradation corrective capacity $C_R$ can be of either a positive value or a negative value with respect to the rated capacity $C_{F1}$.

Figure 7:
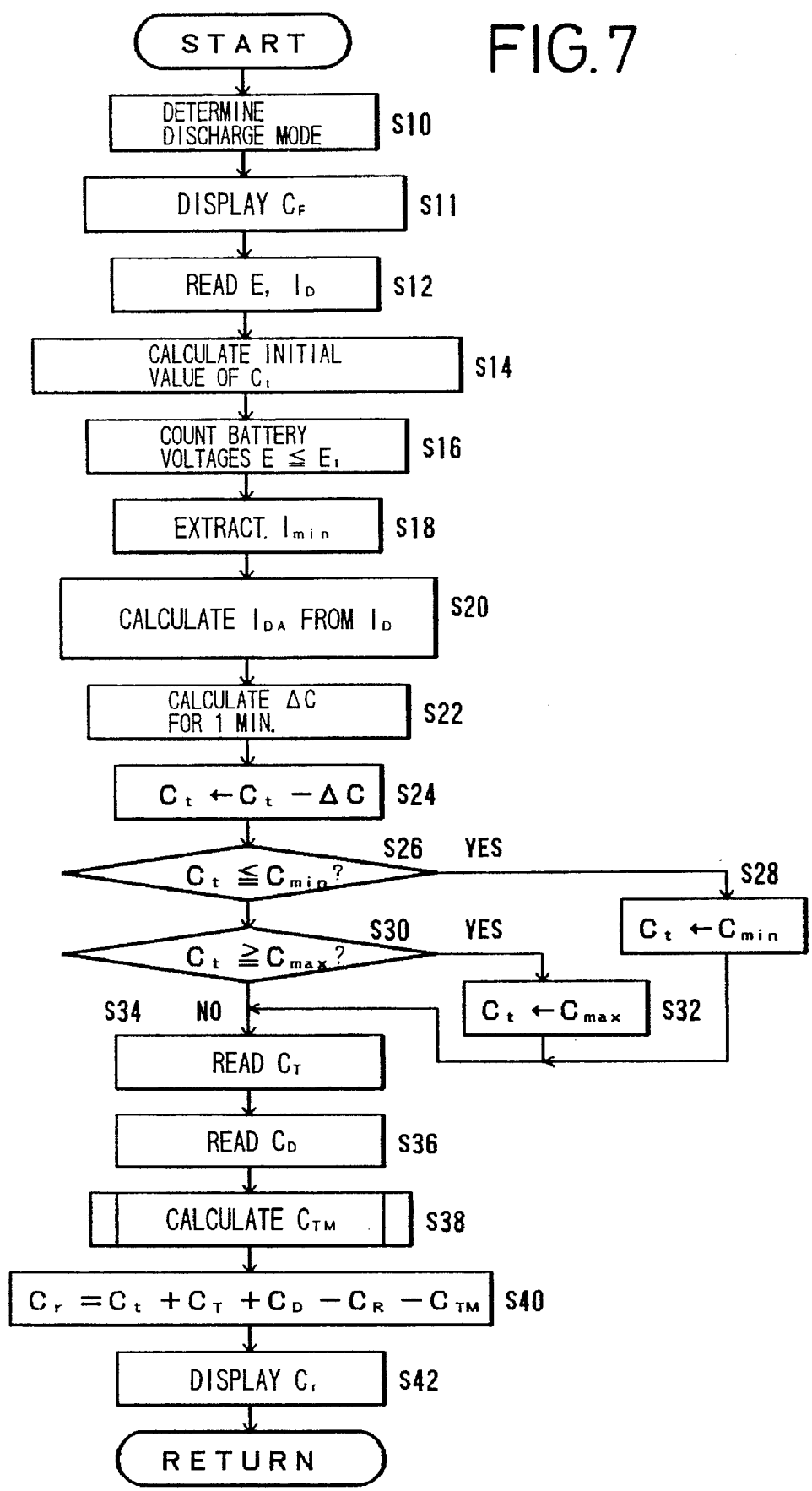
FIG. 7 is a main flowchart of a process of detecting the residual capacity of the batteries in a discharge mode.

If the residual capacity determining flag is "1" in the step S38-76, or if an average maximum output density $P_A$ has not been determined, then control returns to the main routine shown in FIG. 7.

If the WAT1 flag is "1" in the step S38-74, the ECU 22 determines whether the minimum discharge current $I_{min}$ extracted in the step S18 is smaller than the threshold K1 for determining a reduction in the residual capacity C or not in a step S38-80. If the minimum discharge current $I_{min}$ is not smaller than the threshold K1, then the ECU 22 executes the step 38-76 and following steps. If the minimum discharge current $I_{min}$ is smaller than the threshold K1, then the ECU 22 determines that the residual capacity C is smaller than "0", and sets the residual capacity determining flag to "1" in a step S38-82, and thereafter, control returns to the main routine shown in FIG. 7.

If the WAT2 flag is "1" in the step S38-72, the ECU 22 determines that the residual capacity C is smaller than "0", and sets the residual capacity determining flag to "1" in the step S38-82, and thereafter, control returns to the main routine shown in FIG. 7.

As described above, in the discharge mode, an uncorrected residual capacity $C_t$ of the batteries is calculated every minute from an initial value of the uncorrected residual capacity $C_t$ and an integrated value of discharge quantities $\Delta C$ for one minute, and a corrected residual capacity $C_r$ produced by correcting the uncorrected residual capacity $C_t$ with the temperature corrective capacity $C_T$, the current corrective value $C_D$, the degradation corrective capacity $C_R$, and the temporary corrective capacity $C_{TM}$, is displayed on the residual capacity indicator 52.

The driver of the electric vehicle can easily read the residual capacity C of the batteries 12 with respect to the fully charged capacity $C_F$ from the position indicating the fully charged capacity $C_F$ displayed on the fully charged capacity indicator 54 and the position indicating the residual capacity C displayed on the residual capacity indicator 52.

If the position indicating the fully charged capacity $C_F$ displayed on the fully charged capacity indicator 54 and the position indicating the battery temperature T displayed on the temperature indicator 50 are of the same level, then the driver can determine that any discharge-induced degradation of the fully charged capacity $C_F$ has not occurred in the batteries 12. If the displayed position of the battery temperature T is lower than the displayed position of the fully charged capacity $C_F$, then the driver can determine that a discharge-induced degradation of the fully charged capacity $C_F$ has occurred in the batteries 12.

If the position indicating the battery temperature T displayed on the temperature indicator 50 and the position indicating the residual capacity C displayed on the residual capacity indicator 52 are of the same level, then the driver can determine that no combined degradation has occurred in the batteries 12. If the position indicating the battery temperature T displayed on the temperature indicator 50 and the position indicating the residual capacity C displayed on the residual capacity indicator 52 are not of the same level, then the driver can determine that a combined degradation has occurred in the batteries 12.

Figure 16:
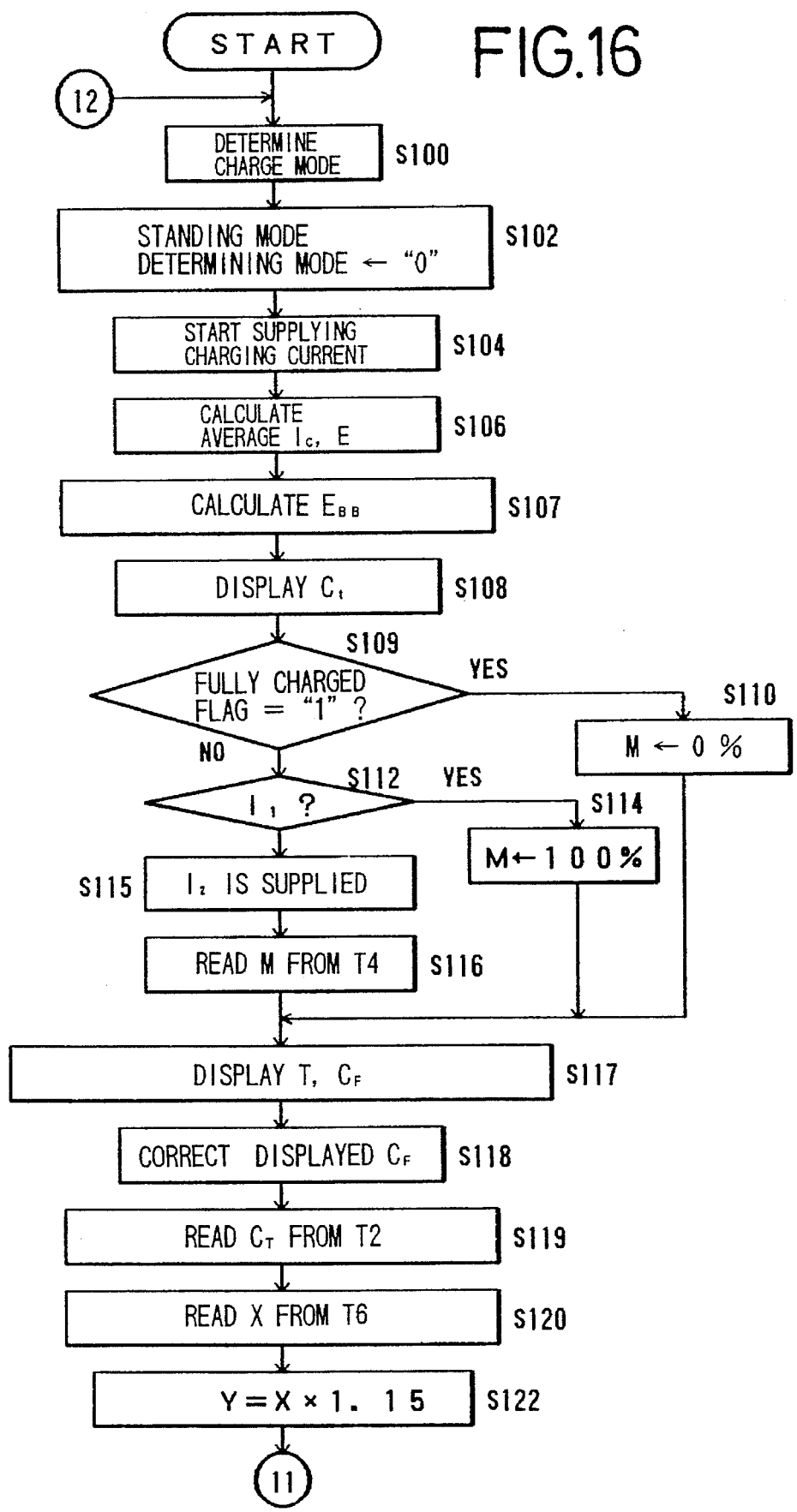
FIGS. 16 and 17 are flowcharts of a process of detecting the residual capacity of the batteries in a charge mode.
Figure 17:
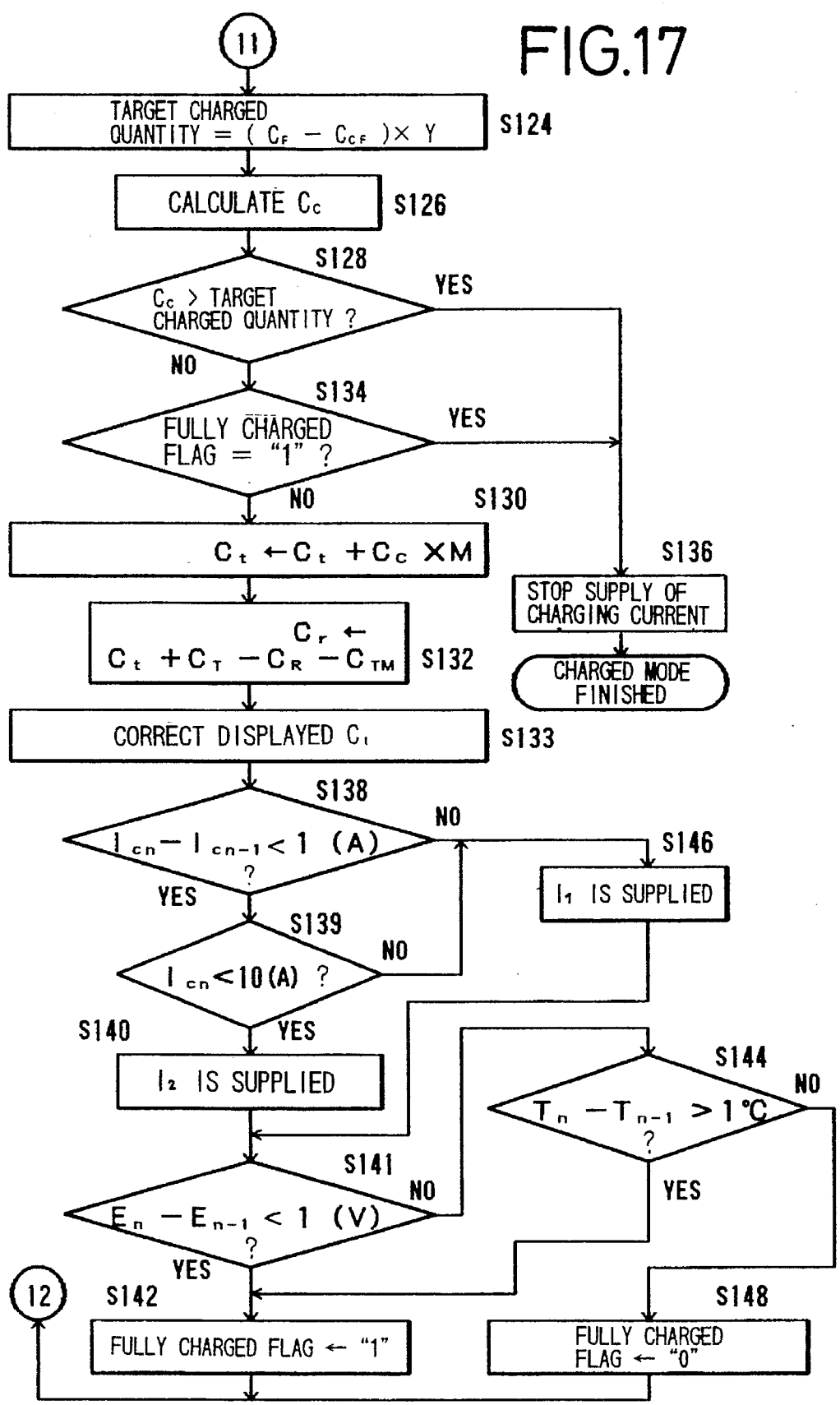

A process of detecting and displaying a residual capacity C of the batteries 12 in the charge mode will be described below with reference to FIGS. 16 and 17.

Figure 18A:
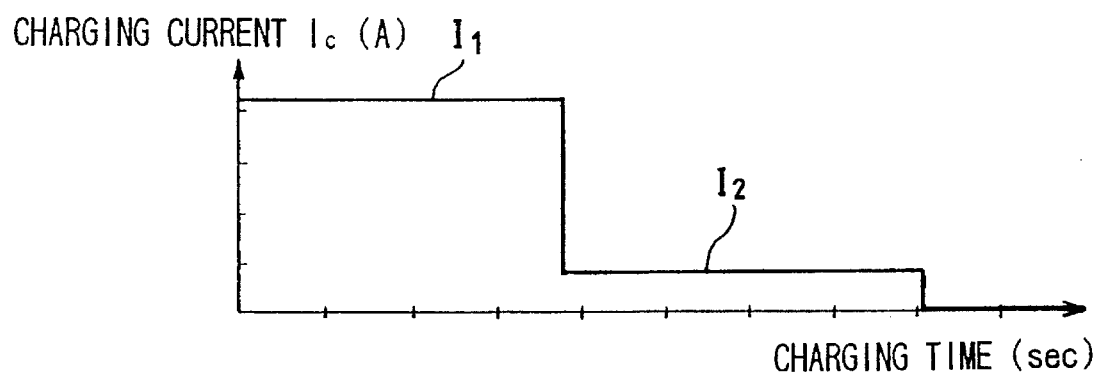
FIG. 18A is a graph showing the waveforms of charging currents supplied from a battery charger to batteries.
Figure 18B:
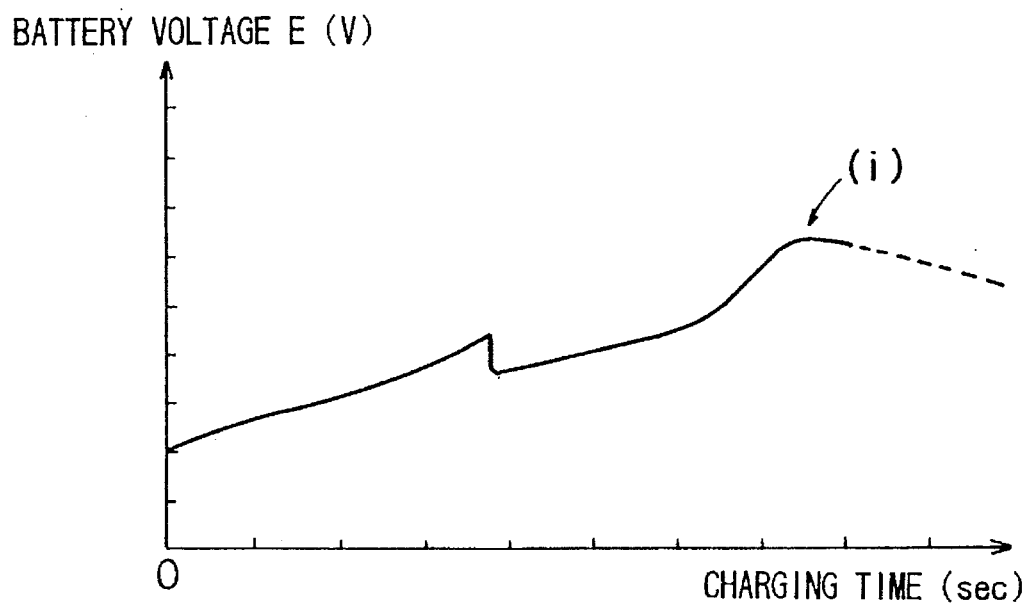
FIG. 18B is a graph showing how the voltage across the batteries varies when they are charged by the charging currents shown in FIG. 18A.

In this embodiment, the batteries 12 are charged by a two-stage constant-current charging process in which a first current $I_1$ is supplied for a predetermined period of time to charge the batteries 12 and thereafter a second current $I_2$ which is lower than the first current $I_1$ is supplied to charge the batteries 12. FIG. 18A shows the waveforms of the first and second currents $I_1$, $I_2$. FIG. 18B shows how the waveform of the battery voltage E varies when the batteries 12 are charged by the first and second currents $I_1$, $I_2$ shown in FIG. 18A.

When the charging connector 26 connected to the battery charger 14 is joined to the charging connector 24 on the electric vehicle, the connection sensor 28 associated with the charging connector 24 outputs a connection signal to the ECU 22. The ECU 22 now determines that the batteries 12 are in the charge mode in a step S100 (see FIG. 16), and sets a standing mode determining flag to "0" in a step S102. The ECU 22 also outputs a signal to operate the switcher 34 to disconnect the motor Mo from the batteries 12.

Then, the battery charger 14 starts supplying a charging current $I_c$ to the batteries 12 in a step S104. Data of the charging current $I_c$ detected by the current detector 16 are supplied to the ECU 22, and data of the battery voltage E detected by the voltage detector 18 are supplied to the ECU 22.

The charging current $I_c$ and the battery voltage E are sampled at predetermined sampling times, e.g., at a period of 100 msec. Specifically, 600 data per minute of the charging current $I_c$ and 600 data per minute of the battery voltage E are read by the ECU 22, and stored in the discharge current data storage area 44b and the battery voltage data storage area 44c, respectively. The ECU 22 calculates an average charging current $I_c$ for one minute and an average value of the battery voltage E for one minute in a step S106, and then calculates a battery voltage $E_{BB}$ per battery in a step S107. Based on the calculated battery voltage $E_{BB}$, the ECU 22 reads an uncorrected residual capacity $C_t$ from the look-up table T1, and displays the uncorrected residual capacity $C_t$ on the residual capacity indicator 52 (see FIG. 19 at (f)) in a step S108.

The ECU 22 determines whether a fully charged flag is set to "1" or not, i.e., whether the batteries 12 are fully charged or not, in a step S109. If the batteries 12 are fully charged, then the ECU 22 determines that the charging current $I_c$ supplied from the battery charger 14 is all converted to heat without being converted into a residual capacity C, and that the proportion (charging efficiency M) of a current which is converted into the residual capacity $C_t$ in the batteries 12, of the supplied charging current $I_c$ is 0%, and stores the charging efficiency M of 0% in the charging efficiency storage area 44i in a step S110.

If the fully charged flag is not set to "1" in the step S109, then the ECU 22 determines that the batteries 12 are not fully charged, and determines whether the charging current $I_c$ supplied from the battery charger 14 is the first current $I_1$ or not in a step S112. If the supplied charging current $I_c$ is the first current $I_1$, then the ECU 22 determines that the supplied charging current $I_c$ is all converted into the residual capacity $C_t$ in the batteries 12, i.e., the charging efficiency M is 100%, and stores the charging efficiency M of 100% in the charging efficiency storage area 44i in a step S114.

If the supplied charging current $I_c$ is not the first current $I_1$, then the ECU 22 determines that the second current $I_2$ is supplied from the battery charger 14 in a step S115. Based on the battery voltage $E_{BB}$ calculated in the step S107, the ECU 22 reads a charging efficiency M from the look-up table T4 stored in the LUT memory 46, and stores the read charging efficiency M in the charging efficiency storage area 44i in a step S116.

In the steps S108~S116, either the charging efficiency M of 0%, or the charging efficiency M of 100%, or the charging efficiency M read from the look-up table T4 is stored in the charging efficiency storage area 44i.

Then, the ECU 22 reads a battery temperature T through the temperature detector 20 and displays the battery temperature T on the temperature indicator 50 (see FIG. 19 at (g)) in a step S117. At the same time, the ECU 22 reads a fully charged capacity $C_F$ from the look-up table T7 stored in the LUT memory 46 based on the battery temperature T, and displays the fully charged capacity $C_F$ on the fully charged capacity indicator 54 (see FIG. 19 at (h)) in the step S117. Then, the ECU 22 reads the degradation corrective capacity $C_R$ calculated in the discharge mode and stored in the residual capacity corrective data storage area 44f, corrects the fully charged capacity $C_F$ read from the look-up table T7 with the degradation corrective capacity $C_R$, and displays the corrected fully charged capacity $C_F$ on the fully charged capacity indicator 54 (see FIG. 19 at (j)) in a step S118. The fully charged capacity $C_F$ on the fully charged capacity indicator 54 is corrected in the same manner as the residual capacity C displayed on the residual capacity indicator 52.

The ECU reads a temperature corrective capacity $C_T$ from the look-up table T2 stored in the LUT memory 46 based on the battery temperature T in a step S119, reads a temperature corrective coefficient X of a charging rate Y from the look-up table T6 based on the battery temperature T in a step S120, and multiplies the temperature corrective coefficient X by a certain marginal percentage, e.g., 115%, thus producing the charging rate Y (Y=×1.15) in a step S122. The charging rate Y represents the difference between the rated capacity $C_{F1}$ and the present corrected residual capacity $C_r$ of the batteries 12, i.e., a coefficient of a target charged quantity.

Then, the ECU 22 subtracts an initial value of the uncorrected residual capacity $C_t$ of the batteries 12, which has been determined when the batteries 12 start being charged, from the rated capacity $C_{F1}$ of the batteries 12, thereby determining a target charged quantity, and multiplies the target charged quantity by the charging rate Y that has been temperature-compensated, thereby determining a target charged quantity according to the following equation (6) in a step S124 (see FIG. 17):

$$\text{Target charged quantity} = (C_F - C_{CF}) \times Y. \tag{6}$$

Since the charging rate Y has been multiplied by 115% in the step S122, the target charged quantity is set to a value which is 15% higher than the rated capacity $C_{F1}$.

Then, the ECU calculates charging quantities ΔC for one minute from the average charging current $I_{CA}$ calculated in the step S106, and integrates the charging quantities ΔC into an integrated charging quantity $C_c$ in a step S126.

The ECU 22 then determines whether the integrated charging quantity $C_c$ is greater than the target charged quantity or not in a step S128. If the integrated charging quantity $C_c$ is not greater than the target charged quantity, then the ECU 22 determines whether the fully charged flag has been set to "1" or not in a step S134. If the fully charged flag has not been set to "1", then a present corrected residual capacity $C_r$ is calculated as follows:

The ECU 22 multiplies the integrated charging quantity $C_c$ which has been integrated from the start of the charge mode by the charging efficiency M which is stored in the RAM 44 in the step S110, S114, or S116, thus determining a charged quantity ($C_c \times M$), and a present corrected residual capacity $C_r$ is calculated from the charged quantity ($C_c \times M$) and the initial value of the uncorrected residual capacity $C_I$ according to the following equation (7) in a step S130:

$$C_I \leftarrow C_I + C_c \times M. \tag{7}$$

Then, the ECU 22 calculates a corrected residual capacity $C_r$ by correcting the uncorrected residual capacity $C_I$ with the temperature corrective capacity $C_T$ read in the step S118 and the degradation corrective capacity $C_R$ and the temporary corrective capacity $C_{TM}$ which have been calculated and stored in the residual capacity corrective data storage area 44f in a previous charge mode according to the following equation (8) in a step S132:

$$C_r \leftarrow C_I + C_T - C_R - C_{TM}. \tag{8}$$

The ECU 22 corrects the value of the uncorrected residual capacity $C_I$ displayed on the residual capacity indicator 52 with the calculated corrected residual capacity $C_r$ (see FIG. 19 at (m)) in a step S133.

With the batteries 12 being thus charged, the residual capacity C of the batteries 12 which is displayed on the residual capacity indicator 52 progressively increases.

If the integrated charged quantity $C_c$ is greater than the target charged quantity in the step S128, then the ECU 22 determines that the integrated charged quantity $C_c$ has reached the target charged quantity, i.e., the batteries 12 have sufficiently been charged. The ECU 22 outputs a signal to stop the supply of the charging current $I_c$ from the battery charger 14 to the batteries 12 in a step S136, thereby finishing the charge mode.

If the fully charged flag has been set to "1" in the step S134, then the ECU 22 determines that the integrated charged quantity $C_c$ has reached the target charged quantity, and stops the supply of the charging current $I_c$ from the battery charger 14 to the batteries 12 in the step S136.

The fully charged flag used to determine whether the charge mode is to be finished or not is set as a result of a fully charged condition determining subroutine which is executed at a predetermined period, e.g., every 30 minutes.

The fully charged condition determining subroutine will be described below.

The ECU 22 reads a present charging current $I_{cn}$ and determines the difference between the present charging current $I_{cn}$ and a previous charging current $I_{cn-1}$, i.e., a charging current supplied 30 minutes ago and stored in the RAM 44, is smaller than 1 (A) or not in a step S138. If the current difference is smaller than 1 (A), then the ECU 22 determines that the charging current $I_c$ has not changed from the first current $I_1$ to the second current $I_2$ in the 30 minutes.

Then, the ECU 22 determines whether the present charging current $I_{cn}$ is smaller than 10 (A) in a step S139. If the present charging current $I_{cn}$ is smaller than 10 (A), then the ECU 22 determines that the second current 12 is supplied from the battery charger 14 to the batteries $I_2$ in a step S140. The ECU 22 determines whether the difference between a present battery voltage $E_n$ and a previously measured battery voltage $E_{n-1}$ is smaller than a preset value, e.g., 1 (V), or not in a step S141. If the difference is smaller than 1 (V), then the ECU 22 sets the fully charged flag to "1" in a step S142, and repeats the step S100 and following steps again. Since the fully charged flag has been set to "1", control goes from the step S134 to the step S136 to finish the charge mode.

If the voltage difference is not smaller than 1 (V) in the step S141, since the batteries 12 are not fully charged, the ECU 22 determines that the battery voltage E is increasing, and determines whether the difference between a present battery temperature $T_n$ and a previously measured battery temperature $T_{n-1}$ which has been stored in the battery temperature storage area 44h is greater than a preset value, e.g., 1° C., or not in a step S144. If the temperature difference is greater than 1° C., then the ECU 22 determines that the batteries 12 are fully charged, and sets the fully charged flag to "1" in the step S142.

More specifically, when the batteries 12 are fully charged, the rate of increase of the battery voltage E is lowered (see FIG. 18B at (i)), and a greater proportion of the charging current $I_c$ is converted into heat, so that the battery temperature T increases. Consequently, if the battery voltage E varies within 1 (V) or the battery temperature T varies beyond 1° C. while the second current $I_2$ is being supplied from the battery charger 14 to the batteries 12, then the batteries 12 are determined as being fully charged.

If the difference between the present charging current $I_{cn}$ and the previous charging current $I_{cn-1}$ is not smaller than 1 (A) in the step S138, or if the charging current $I_c$ is not smaller than 10 (A) in the step S139, then the ECU 22 determines that the first current $I_1$ is being supplied from the battery charger 14 to the batteries 12 in a step S146, and then executes the step S141 and following steps. If the voltage difference is not smaller than 1 (V) in the step S141 and also if the temperature difference is not greater than 1° C. in the step S144, then the ECU 22 determines that the batteries 12 are not fully charged, and sets the fully charged flag to "0" in a step S148, and then executes the step S100 and following steps again.

As described above, if the displayed residual capacity C has not reached the same level as the displayed fully charged capacity $C_F$ regardless of the fact that the batteries 12 have been determined as being fully charged, then it is possible to determine a degraded quantity of the batteries 12 at the time they are charged, from the difference between the displayed position of the residual capacity C and the displayed position of the fully charged capacity $C_F$ (see FIG. 19 at ($L_1$)).

It is also possible to determine a combined degraded quantity of the batteries 12 from the difference between the displayed battery temperature T at the time the batteries 12 have been determined as being fully charged, and the displayed residual capacity C (see FIG. 19 at ($L_2$)).

In the charge mode, the indicators 50, 52, 54 display respective data when the driver turns the ignition key inserted in the ignition switch 30 to a position for energizing the electric system on the electric vehicle.

Figure 20:
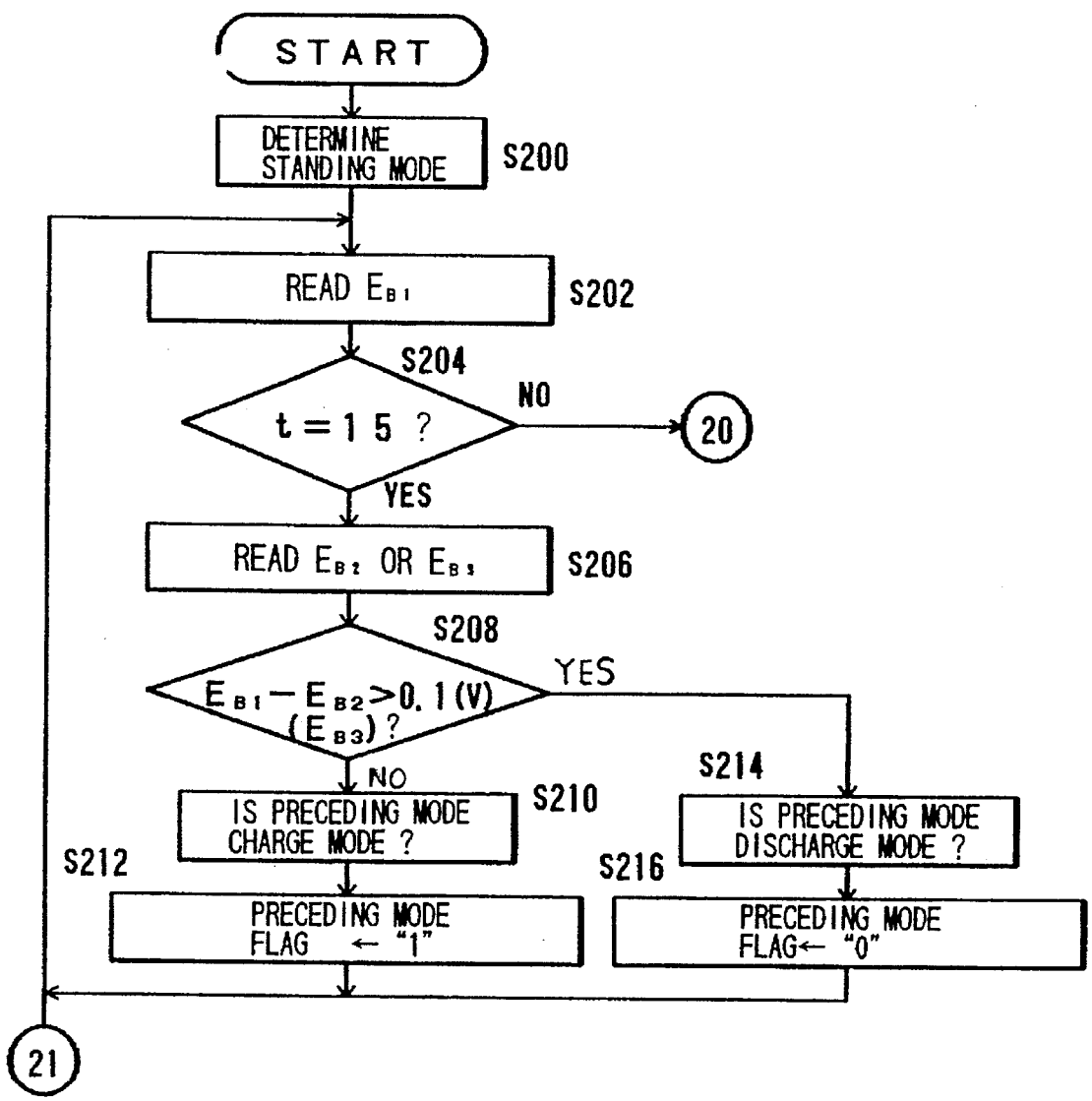
FIGS. 20 and 21 are flowcharts of a process of detecting the residual capacity of the batteries in a standing mode.

A process of detecting a residual capacity C of the batteries 12 in the standing mode will be described below with reference to FIGS. 20 and 21.

When the ignition key is removed from the ignition switch 30, thus finishing the discharge mode, or the charging connector 26 is disconnected, thus finishing the charging mode, the ECU 22 determines that the batteries 12 are in a standing mode in a step S200 (see FIG. 20), and reads a battery voltage E at the time the batteries 12 are determined as being in the standing mode, as an initial battery voltage $E_{B1}$ in the standing mode in a step S202.

Then, the ECU 22 determines whether time t that has elapsed after the batteries 12 are determined as being in the standing mode has reached 15 minutes or not in a step S204. If 15 minutes have been reached, then the ECU 22 reads a battery voltage $E_{B2}$ or $E_{B3}$ in a step S206, and determines whether the battery voltage $E_{B2}$ or $E_{B3}$ has increased 0.1 (V) from the initial battery voltage $E_{B1}$ or not in a step S208. If the battery voltage $E_{B2}$ or $E_{B3}$ has not increased 0.1 (V) from the initial battery voltage $E_{B1}$, then the ECU 22 determines that the preceding mode was the charge mode in a step S210, and then sets a preceding mode flag to "1" in a step S212.

If the battery voltage $E_{B2}$ or $E_{B3}$ has increased 0.1 (V) from the initial battery voltage $E_{B1}$, then the ECU 22 determines that the preceding mode was the discharge mode in a step S214, and then sets a preceding mode flag to "0" in a step S216.

Figure 22:
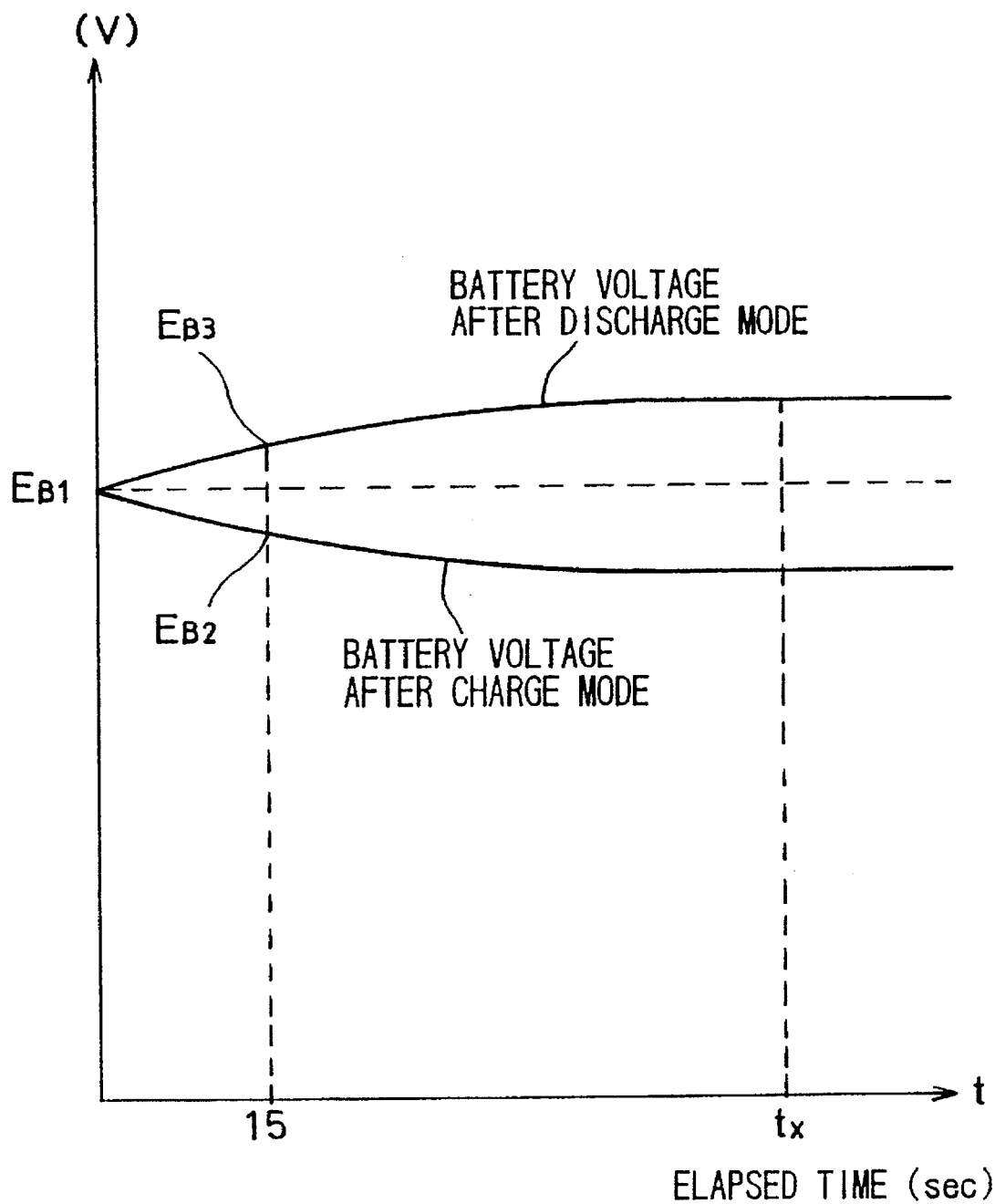
FIG. 22 is a graph illustrative of how the voltage across the batteries varies with respect to the time in which the batteries are left to stand.

As shown in FIG. 22, after the charge mode is finished, the battery voltage E tends to drop and become stable after elapse of a predetermined time $T_x$, and after the discharge mode is finished, the battery voltage E tends to increase immediately after the discharge mode. Therefore, the preceding mode can be determined based on whether the battery voltage $E_{B2}$ or $E_{B3}$ has decreased or increased from the initial battery voltage $E_{B1}$ after elapse of 15 minutes.

Figure 21:
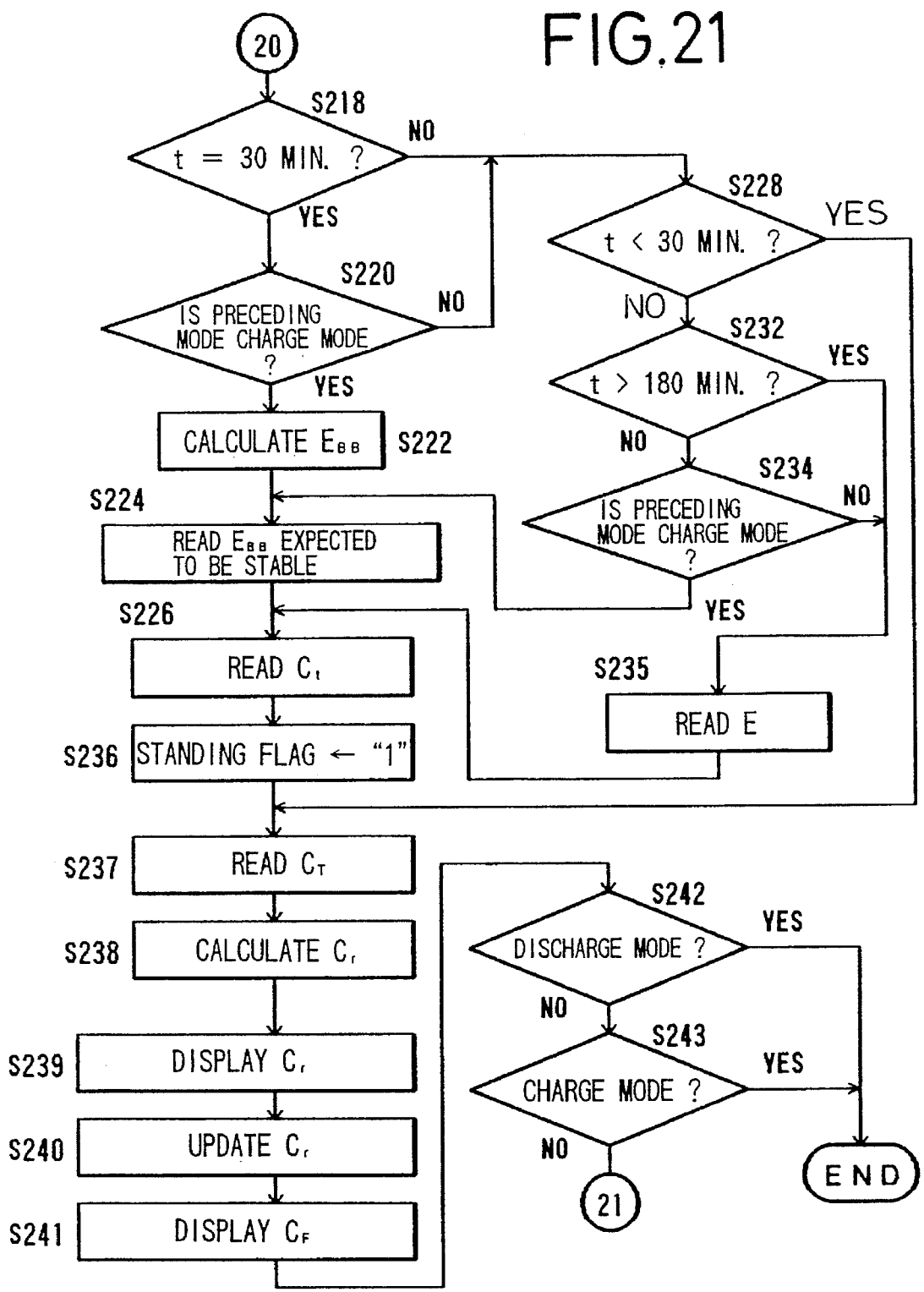

Then, the ECU 22 determines whether the time t that has elapsed after the batteries 12 are determined as being in the standing mode has reached 30 minutes in a step S218 (see FIG. 21). If the time t has reached 30 minutes, then the ECU 22 determines whether the preceding mode flag is "1" or not, i.e., whether the preceding mode is the charge mode or not, in a step S220. If the preceding mode is the charge mode, the ECU 22 reads the battery voltage $E_{B2}$ at this time through the voltage detector 18, and calculates a battery voltage $E_{BB}$ per battery in a step S222.

The ECU 22 reads a battery voltage $E_{BB}$ per battery which is expected to be stable after elapse of the time $t_x$ from the look-up table T5 based on the calculated battery voltage $E_{BB}$ per battery in a step S224. The ECU 22 reads an uncorrected residual capacity $C_t$ from the look-up table T1 based on the read battery voltage $E_{BB}$, and stores the uncorrected residual capacity $C_t$ in the uncorrected residual capacity storage area 44e in a step S226.

If the time t has not reached 30 minutes, then the ECU 22 determines whether the time t is smaller than 30 minutes or not in a step S228. If the time t has exceeded 30 minutes, then the ECU 22 determines whether the time t has exceeded 180 minutes or not in a step S232. If the time t has not exceeded 180 minutes, i.e., if the time t has exceeded 30 minutes, but is smaller than 180 minutes, then the ECU 22 reads the preceding mode flag and determines whether the preceding mode is the charge mode or not in a step S234. If the preceding mode flag is "1", i.e., if the preceding mode is the charge mode, the ECU 22 executes the step S224 and following steps to read an uncorrected residual capacity $C_t$ from the look-up table T1 based on a battery voltage $E_{BB}$ per battery which is expected to be stable, and store the read uncorrected residual capacity $C_t$ in the uncorrected residual capacity storage area 44e.

Since the uncorrected residual capacity $C_t$ is read from the look-up table T1, the uncorrected residual capacity $C_t$ is not determined based on the battery voltage E which is decreasing after the batteries 12 have been charged, but determined based on the battery voltage $E_{BB}$ per battery which is expected to be stable. Therefore, the charged quantity is prevented from becoming insufficient at the time the batteries 12 are charged immediately thereafter, because the uncorrected residual capacity $C_t$ based on the battery voltage $E_{BB}$ after it has become stable is smaller than the uncorrected residual capacity $C_t$ based on the battery voltage $E_{BB}$ immediately after the charging mode is finished.

If the time t has exceeded 180 minutes in the step S232, or if the preceding mode flag is not "1", i.e., the preceding mode is not the charge mode, in the step S234, the ECU 22 reads the battery voltage E at predetermined sampling times in a step S235, and then reads an uncorrected residual capacity $C_t$ at the battery voltage E from the look-up table T1 in which the uncorrected residual capacity $C_t$ has been stored in the step S226. The ECU 22 updates the preceding uncorrected residual capacity $C_t$ stored in the uncorrected residual capacity storage area 44e into the uncorrected residual capacity $C_t$ thus read.

When the uncorrected residual capacity $C_t$ is read from the look-up table T1, the ECU 22 sets the standing flag to "1" in a step S236. The standing flag "1" indicates that an integration error of the uncorrected residual capacity $C_t$ due to the integration of charged quantities $\Delta C_c$ or the integration of charged quantities $\Delta C$, of the uncorrected residual capacity $C_t$ which has been calculated in the discharge mode, is canceled.

More specifically, for determining an uncorrected residual capacity $C_t$ by integrating charged quantities $\Delta C$, an average discharge current $I_{DA}$ of discharge currents $I_D$ for one minute is calculated. When the average discharge current $I_{DA}$ is determined, an error is produced. Such errors are integrated to introduce an integration error into the calculated uncorrected residual capacity $C_t$. When the uncorrected residual capacity $C_t$ which contains an integration error of charged quantities $\Delta C$ is updated into the uncorrected residual capacity $C_t$ read from the look-up table T1, the integration error of the uncorrected residual capacity $C_t$ is canceled.

If the time t is shorter than 30 minutes in the step S228, then a temperature corrective capacity $C_t$ is determined in a step S237.

If the time t has exceeded 180 minutes or if the time t has exceeded 30 minutes and shorter than 180 minutes and the preceding mode is not the charge mode, the ECU 22 calculates a battery voltage $E_{BB}$ per battery from the battery voltage E that has been detected at predetermined sampling times, and reads an uncorrected residual capacity $C_t$ from the look-up table T1 based on the calculated battery voltage $E_{BB}$ per battery.

If the preceding mode flag is not "1" in the step S220, the ECU 22 determines that the preceding mode is the discharge mode, and executes the step S228 and following steps.

The ECU 22 reads a battery temperature T through the temperature detector 20, and reads a temperature corrective capacity $C_T$ from the look-up table T2 based on the read battery temperature T in the step S237. The ECU 22 calculates a corrected residual capacity $C_r$ by correcting the uncorrected residual capacity $C_t$ with the temperature corrective capacity $C_T$ read in the step S237 and the degradation corrective capacity $C_R$ and the temporary corrective capacity $C_{TM}$ which have been calculated and stored in the residual capacity corrective data storage area 44f according to the equation: $C_r \leftarrow C_t + C_T - C_R - C_{TM}$ in a step S238. The ECU 22 displays the corrected residual capacity $C_r$ on the residual capacity indicator 52 in a step S239. The ECU updates the corrected residual capacity $C_r$ displayed on the residual capacity indicator 52 with the corrected residual capacity $C_r$ which is calculated every minute in a step S240.

The battery temperature T read by the ECU 22 through the temperature detector 20 is displayed on the temperature indicator 50. Based on the read battery temperature T, the fully charged capacity $C_F$ of the batteries 12 is read from the look-up table T7, and corrected with the degradation corrective capacity $C_R$ stored in the residual capacity corrective data storage area 44f when the batteries 12 are being discharged or charged. The corrected fully charged capacity $C_F$ is displayed on the fully charged capacity indicator 54 in a step S241.

Then, the ECU 22 repeatedly executes the step S202 and following steps to calculate the corrected residual capacity $C_r$ until it determines the batteries 12 as being in the discharge mode in a step S242 or as being in the charge mode in a step S243.

In the standing mode, as described above, since the residual capacity indicator 52 displays a reduction in the residual capacity C of the batteries 12 which is caused when the batteries 12 are discharged of their own accord by being left to stand, the driver can read the latest residual capacity C of the batteries 12.

As in the charge mode and the discharge mode, it is possible to determine a degraded quantity of the batteries 12 from the difference between the displayed position of the battery temperature T on the temperature indicator 50 and the displayed position of the fully charged capacity $C_F$ on the fully charged capacity indicator 54.

Figure 23:
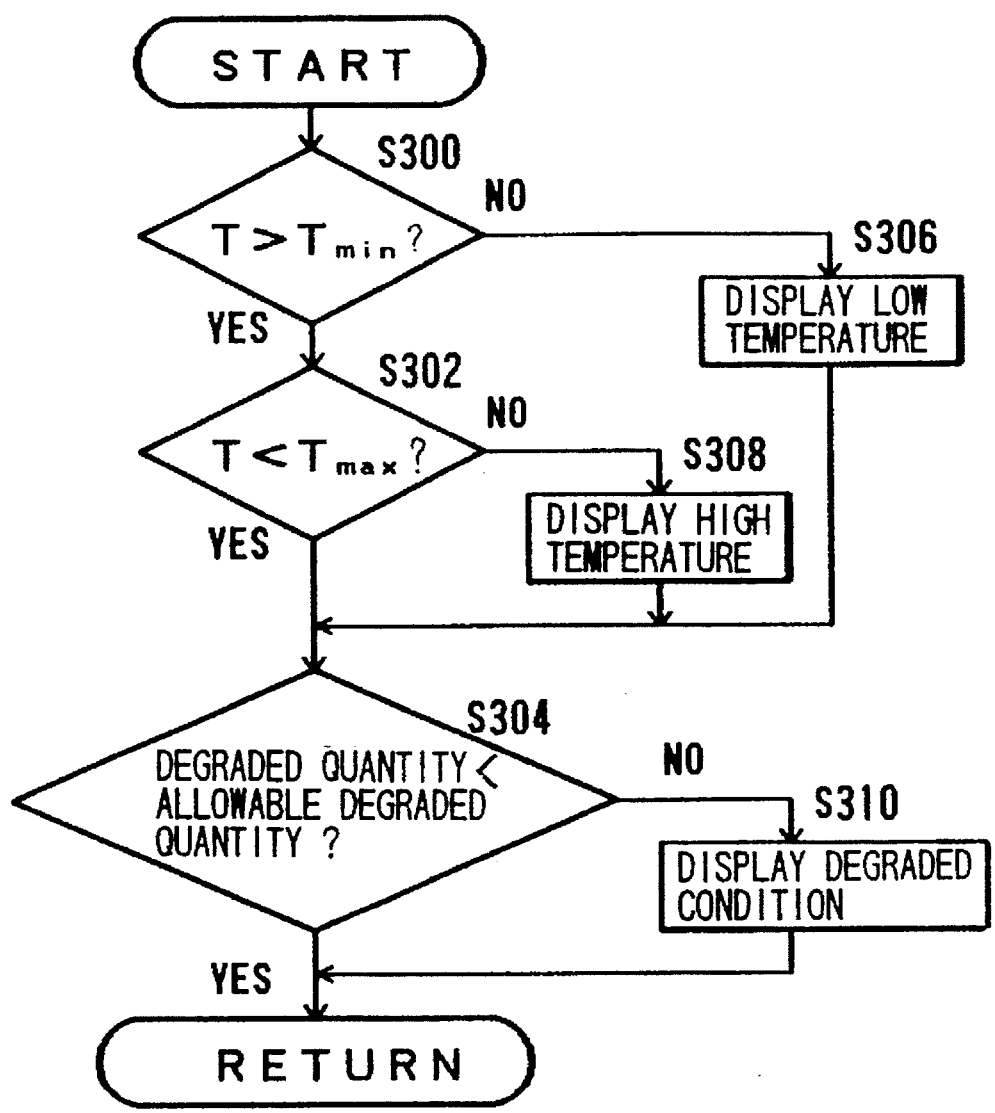
FIG. 23 is a flowchart of a process of displaying the battery temperature and a warning upon degradation of the batteries.

A warning subroutine for indicating a warning when the battery temperature T and the degraded quantity exceed respective preset values will be described below with reference to FIG. 23.

The ECU 22 determines whether the battery temperature T is higher than a minimum temperature (charging minimum temperature) $T_{min}$ suitable for charging which is stored in the threshold storage area 44a in a step S300. If the battery temperature T is higher than the charging minimum temperature $T_{min}$, then the ECU 22 determines whether the battery temperature T is lower than a maximum temperature (charging maximum temperature) $T_{max}$ suitable for charging which is stored in the threshold storage area 44a in a step S302.

If the battery temperature T is lower than the charging maximum temperature $T_{max}$, then the ECU 22 determines whether a degraded quantity of the batteries 12 is smaller than an allowable degraded quantity stored in the threshold storage area 44a in a step S304. If the degraded quantity of the batteries 12 is smaller than the allowable degraded quantity, then the ECU repeatedly detects and displays a residual capacity C in the main routine shown in FIG. 7.

Figure 24A:
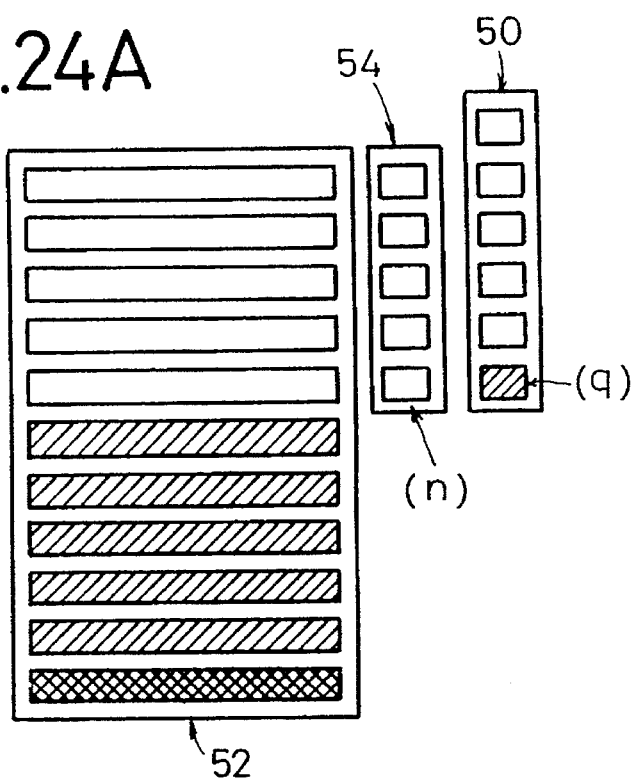
FIG. 24A is a view showing a warning displayed when a reduction in the battery temperature is detected.

If the battery temperature T is not higher than the charging minimum temperature $T_{min}$ in the step S300, then the ECU 22 determines the battery temperature T as being too low for charging, and turns off the fully charged capacity displayed on the fully charged capacity indicator 54 (see FIG. 24A at (n)), and flickers a lowermost display element of the temperature indicator 50 (see FIG. 24A at (q)) in a step S306, and then determines a degraded quantity of the batteries 12 in the step S304.

Figure 24B:
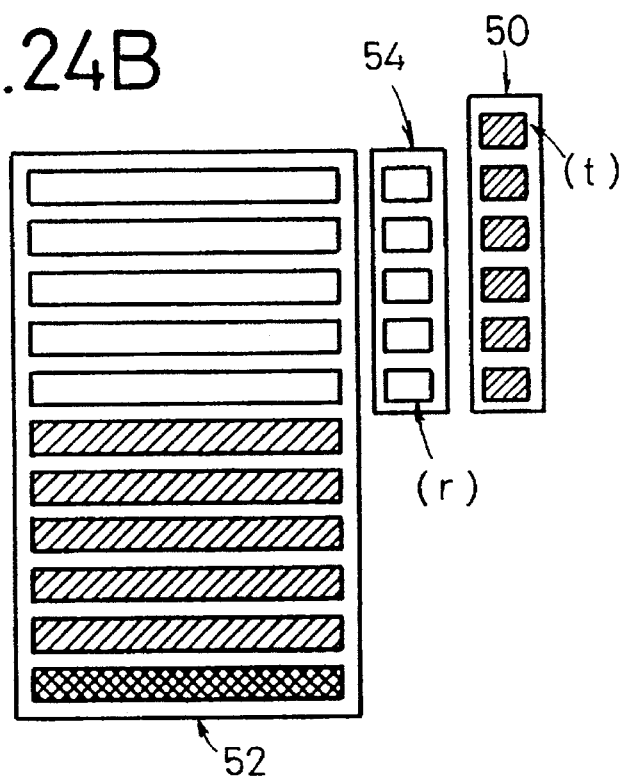
FIG. 24B is a view showing a warning displayed when an increase in the battery temperature is detected.

If the battery temperature T is not lower than the charging maximum temperature $T_{max}$ in the step S302, then the ECU 22 determines the battery temperature T as being too high for charging, and turns off the fully charged capacity displayed on the fully charged capacity indicator 54 (see FIG. 24B at (r)). The ECU 22 also turns on all display elements of the temperature indicator 50, and flickers an uppermost display element of the temperature indicator 50 (see FIG. 24B at (t)) in a step S308, and then determines a degraded quantity of the batteries 12 in the step S304.

Figure 25:
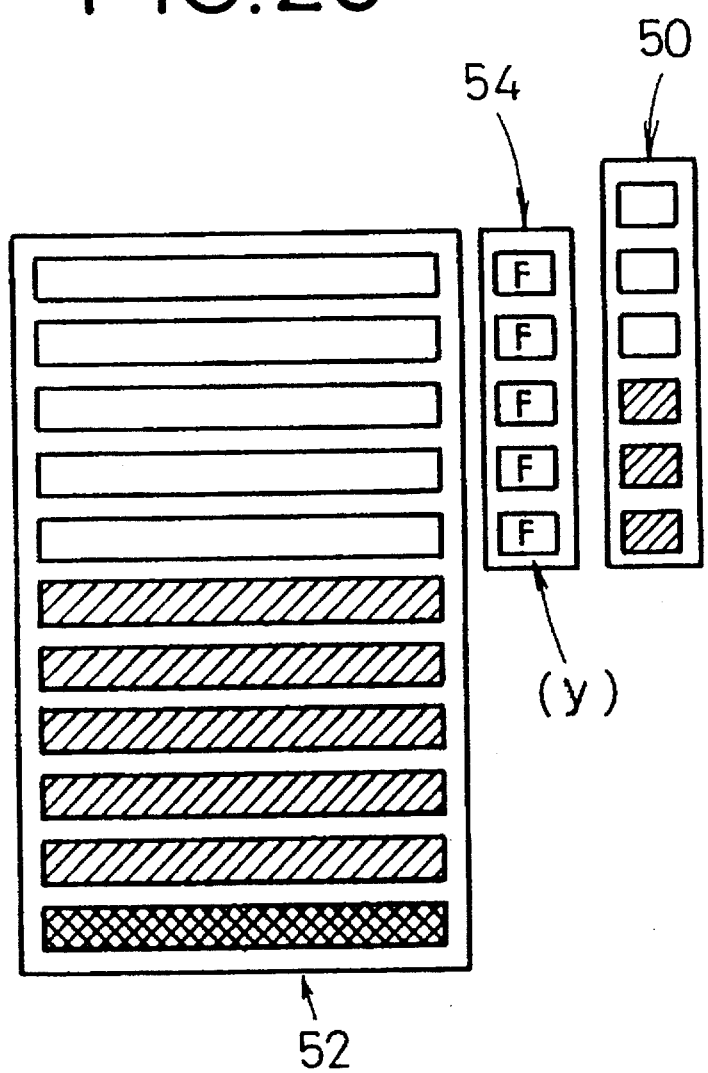
FIG. 25 is a view showing a warning displayed when the battery degradation is detected in the process shown in FIG. 23.

If the degraded quantity of the batteries 12 is not smaller than the allowable degraded quantity, then the ECU flickers all display elements of the fully charged capacity indicator 54 (see FIG. 25 at (y)) in a step S310.

In the warning subroutine, as described above, the ECU 22 determines in the charge mode whether the battery temperature T is in a temperature range suitable for charging. If the battery temperature T is not in a temperature range suitable for charging, then the ECU 22 displays a warning on the fully charged capacity indicator 54 and the temperature indicator 50. If the degraded quantity of the batteries 12 exceeds a preset value, the ECU 22 flickers the display elements of the fully charged capacity indicator 54, indicating to the driver that the service life of the batteries 12 has expired.

The warning subroutine is carried out also in the discharge mode and the charge mode to display a warning relative to the battery temperature T and a degraded condition of the batteries 12 in each of the discharge and charge modes.

In the apparatus according to the present invention, the residual capacity of batteries is digitally displayed on a bar-graph-type indicator. Such an indicator is capable of displaying a residual capacity highly accurately while eliminating any error which would otherwise occur if displayed on a pointer-type meter.

When a battery temperature and a fully charged capacity are displayed in association with each other, it is possible to indicate a degraded condition of batteries as the difference between the levels of the displayed quantities. When a fully charged capacity and a residual capacity of batteries are displayed in association with each other, it is possible to indicate the residual capacity with respect to the fully charged capacity as the difference between the levels of the displayed quantities. Furthermore, it is possible to indicate a combined degraded condition of batteries as the difference between the levels of the displayed position of a battery temperature and the display position of a residual capacity when the charging of the batteries is over.

Although a certain preferred embodiment of the present invention has been shown and described in detail, it should be understood that various changes and modifications may be made therein without departing from the scope of the appended claims.

What is claimed is:

1. An apparatus for displaying a residual capacity of a battery for energizing an electric motor to propel an electric vehicle, comprising:

battery temperature detecting means for detecting a temperature of the battery;

current detecting means for detecting a current of the battery;

voltage detecting means for detecting a voltage of the battery;

battery temperature indicating means composed of a first linear array of spaced light-emitting elements, for displaying the temperature of the battery by way of light emitted from at least one of the light-emitting elements of said first linear array which is in a position corresponding to the temperature of the battery detected by said battery temperature detecting means;

memory means for storing fully charged capacities corresponding respectively to temperatures of the battery;

fully charged capacity reading means for reading one of the fully charged capacities which corresponds to the temperature of the battery detected by said battery temperature detecting means, from said memory means;

fully charged capacity indicating means composed of a second linear array of spaced light-emitting elements, for displaying the fully charged capacity of the battery in association with the temperature of the battery displayed by said battery temperature indicating means by way of light emitted from one of the light-emitting elements of said second linear array which is in a position corresponding to the fully charged capacity read by said fully charged capacity reading means;

residual capacity calculating means for calculating a residual capacity of the battery while the battery is being discharged, based on a discharging current detected by said current detecting means and a voltage detected by said voltage detecting means when the battery is being discharged, and for calculating a residual capacity of the battery while the battery is being charged, based on a charging current detected by said current detecting means and a voltage detected by said voltage detecting means when the battery is being charged; and residual capacity indicating means composed of a third linear array of spaced light-emitting elements, for displaying the residual capacity of the battery in association with the fully charged capacity of the battery displayed by said fully charged capacity indicating means by way of light emitted from at least one of the light-emitting elements of said third linear array which corresponds to the residual capacity calculated by said residual capacity calculating means.

2. An apparatus according to claim 1, wherein said battery temperature indicating means has means for displaying a warning when the temperature of the battery detected by said battery temperature detecting means falls out of a predetermined temperature range suitable for charging the battery.

3. An apparatus according to claim 1, wherein said fully charged capacity indicating means has means for displaying a warning when a degraded quantity of the battery exceeds a preset value.

4. An apparatus according to claim 1, wherein said fully charged capacity indicating means has means for displaying a warning when the temperature of the battery detected by said battery temperature detecting means falls out of a predetermined temperature range suitable for charging the battery.

5. An apparatus according to claim 4, wherein said fully charged capacity indicating means has means for displaying a warning when a degraded quantity of the battery exceeds a preset value.

6. An apparatus according to claim 1, wherein a succession of said light-emitting elements of said first linear array which correspond to the temperature of the battery detected by said battery temperature detecting means are lighted for displaying the battery temperature on said battery temperature indicating means.

7. An apparatus according to claim 1, wherein a succession of said light-emitting elements of said third linear array of said residual capacity indicating means which correspond to the residual capacity of the battery are lighted for displaying the residual capacity of the battery.

8. An apparatus according to claim 4, wherein said battery temperature indicating means has means for displaying a warning when the temperature of the battery detected by said battery temperature detecting means falls out of a predetermined temperature range suitable for charging the battery.

9. An apparatus according to claim 8, wherein said fully charged capacity indicating means has means for displaying a warning when a degraded quantity of the battery exceeds a preset value.

10. An apparatus according to claim 1, wherein said battery temperature indicating means, said fully charged capacity indicating means and said residual capacity indicating means are positioned in adjacent relationship for indicating respective values of battery temperature, fully charged capacity and residual capacity, respectively, in a related manner for indicating a degree of degradation of the battery by a comparison of said respective values.

* * * * *